US011023625B2

(12) United States Patent
Eck et al.

(10) Patent No.: US 11,023,625 B2
(45) Date of Patent: Jun. 1, 2021

(54) COMPUTATIONAL ACCELERATOR ARCHITECTURE FOR CHANGE CONTROL IN MODEL-BASED SYSTEM ENGINEERING

(71) Applicant: Raytheon Company, Waltham, MA (US)

(72) Inventors: Christopher R. Eck, Dunedin, FL (US); Cassandra L. Wellman, St. Petersburg, FL (US); Jagannath Chirravuri, Medfield, MA (US)

(73) Assignee: Raytheon Company, Waltham, MA (US)

( * ) Notice: Subject to any disclaimer, the term of this patent is extended or adjusted under 35 U.S.C. 154(b) by 315 days.

(21) Appl. No.: 16/244,420

(22) Filed: Jan. 10, 2019

(65) Prior Publication Data
US 2020/0226220 A1    Jul. 16, 2020

(51) Int. Cl.
*G06F 30/00* (2020.01)
*G06F 16/21* (2019.01)

(52) U.S. Cl.
CPC ............ *G06F 30/00* (2020.01); *G06F 16/211* (2019.01)

(58) Field of Classification Search
None
See application file for complete search history.

(56) References Cited

U.S. PATENT DOCUMENTS

| 7,603,380 B2 | 10/2009 | Deffler |
| 9,052,907 B2 | 6/2015 | Gres et al. |
| 9,165,090 B2 | 10/2015 | Broodney et al. |
| 2009/0028059 A1* | 1/2009 | Barbaresi ............ H04W 16/22 370/250 |
| 2014/0244218 A1 | 8/2014 | Greenberg et al. |
| 2018/0357358 A1 | 12/2018 | Milstead et al. |

FOREIGN PATENT DOCUMENTS

| CN | 108446767 A | 8/2018 |
| TW | I5903525 B | 7/2017 |
| TW | 202026920 | 7/2020 |

(Continued)

OTHER PUBLICATIONS

Findler, Robert Bruce, et al., "Redex: Practical Semantics Engineering", https://plt.eecs.northwestern.edu/snapshots/current/pdf-doc/redex.pdf, (2018), 243.

(Continued)

*Primary Examiner* — Craig C Dorais
(74) *Attorney, Agent, or Firm* — Schwegman Lundberg & Woessner, P.A.

(57) ABSTRACT

A computational accelerator architecture facilitates change management of works in a model-based system engineering (MBSE) system in which each of the MBSE works includes a plurality of separately-identifiable statements. A linkage data store stores statement-wise, variable-strength linkages between certain statements of the MBSE works, where the linkages are indicative of associations between those certain statements. A revision control engine detects changes made to statements of MBSE works, and selectively indicates calls for revision of other statements in response to those changes based on respective strengths of linkages associated with the changed statements.

25 Claims, 16 Drawing Sheets

(56) References Cited

FOREIGN PATENT DOCUMENTS

| TW | I711969 | 12/2020 |
|---|---|---|
| WO | 2020146041 | 7/2020 |

OTHER PUBLICATIONS

Herzig, Sebastian J. I., et al., "A conceptual basis for inconsistency management in Model-Based Systems Engineering", Procedia CIRP 21, (2014), 52-57.

Liu, Yong-Jin, et al., "A Semantic Feature Language for Concurrent Engineering", Proceedings—2009 11th IEEE International Conference on Computer-Aided Design and Computer Graphics, (Aug. 2009), 383-388.

Nejati, Shiva, et al., "Automated Change Impact Analysis between SysML Models of Requirements and Design", FSE 2016 Proceedings of the 2016 24th ACM SIGSOFT International Symposium on Foundations of Software Engineering, (Nov. 18, 2016), 242-253.

Peleska, Jan, "Industrial-Strength Model-Based Testing—State of the Art and Current Challenges", EPTCS 111, (2013), 3-28.

Qamar, Ahsan, et al., "A Domain-Specific Language for Dependency Management in Model-Based Systems Engineering", Proceedings of MPM 2013, (2013), 7-16.

Schindel, Bill, et al., "Introduction to Pattern-Based Systems Engineering (PBSE): Leveraging MBSE Techniques", GLRC 2013: Leadership Through Systems Engineering, (2013), 135 pgs.

Wang, Haoqi, et al., "Change propagation analysis for system modeling using Semantic Web technology", Advanced Engineering Informatics 35, (Nov. 29, 2017), 17-29.

"International Application Serial No. PCT/US2019/060416, International Search Report dated Apr. 14, 2020", 3 pgs.

"International Application Serial No. PCT/US2019/060416, Written Opinion dated Apr. 14, 2020", 6 pgs.

"Taiwanese Application Serial No. 108137479, Office Action dated Apr. 8, 2020", with machine translation, 8 pgs.

Feldman, S, et al., "A comprehensive approach for managing inter-model inconsistencies in automated production systems engineering", IEEE International Conference on Automation Science and Engineering, (Aug. 24, 2016), 1120-1127.

Hamloui, M El, et al., "Heterogeneous models matching for consistency management", IEEE Eighth International Conference on Research Challenges in Information Science (RCIS), (May 30, 2014), 1-12.

"Taiwanese Application Serial No. 108137479, Response filed Jul. 7, 2020 to Office Action dated Apr. 8, 2020", w English Claims, 141 pgs.

\* cited by examiner

COMPUTATIONAL ACCELERATOR ARCHITECTURE FOR CHANGE CONTROL IN MODEL-BASED SYSTEM ENGINEERING

GOVERNMENT LICENSE RIGHTS

This invention was made with government support under FA8218-17-F-0103 awarded by the Department of the Air Force. The government has certain rights in the invention.

CROSS-REFERENCE TO RELATED APPLICATION

This application is related U.S. patent application Ser. No. 15/845,469 filed Dec. 18, 2017, the disclosure of which is incorporated by reference herein.

TECHNICAL FIELD

Embodiments described herein generally relate to improving the computational performance of data-processing and computational-analysis systems and associated methods and, more particularly, to special-purpose machinery for facilitating model-based system engineering (MBSE) product and project lifecycle management.

BACKGROUND

Model-based system engineering (MBSE) is the formalized application of modeling to support system requirements, design, analysis, verification and validation activities beginning in the conceptual design phase and continuing throughout development and later life cycle phases. In some cases, MBSE may be relied upon to support a project lifecycle that could last decades or even centuries. A model in the present context refers to a simplified expression of a concept, phenomenon, relationship, structure or system. It may be represented in textual, graphical, mathematical, or physical forms. MBSE emphasizes the use of digital models such as M-CAD, ECAD, SysML and UML, as the record of authority to be managed in a data-rich environment alongside other products such as design requirements databases, system architecture descriptions and diagrams, testing plans and procedures, manufacturing procedures, maintenance procedures, installation procedures, and the like. MBSE enables engineering teams to more readily understand design change impacts, communicate design intent, and analyze a system design throughout the development and deployment lifecycle of products and projects.

Challenges faced by organizations as they implement MBSE include linking related model and document components for a given product or project across a diverse set of document and model types, as well as detecting and propagating changes among linked documents and models. For instance, each document may be created or managed by different teams of developers, have different terminology referring to a common concept, be created at different times, be subject to revision at different times, and those revisions may need to be propagated throughout an entire set of models and documents associated with the product or project. To date, this has been largely a human resource-intensive task.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings.

DETAILED DESCRIPTION

Figure 1A:
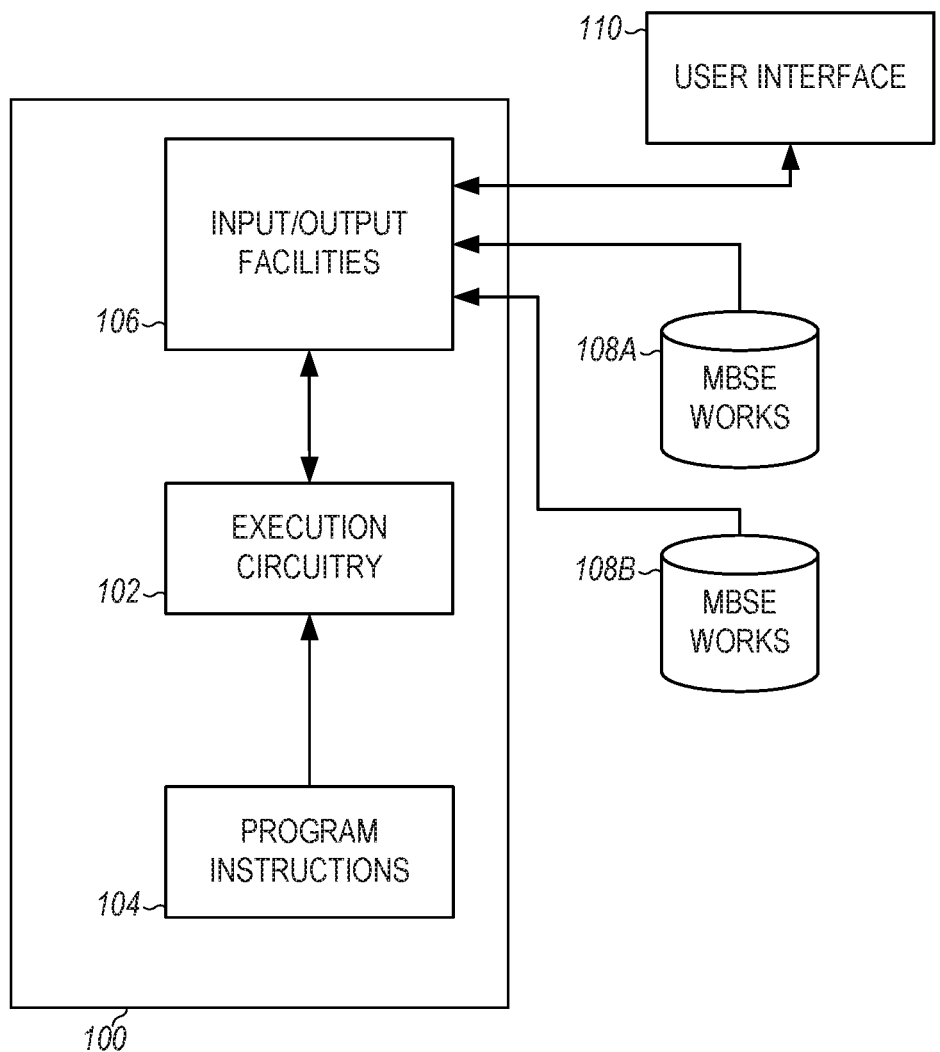
FIG. 1A is a high-level system diagram illustrating a machine implementation according to some embodiments.

Aspects of the embodiments are directed to computationally determining links among and between model-based system engineering (MBSE) work elements over a diverse set of MBSE work types. In the present context, the term MBSE work refers to a digital model, document, database, diagram, procedure, or the like, which is created and managed in connection with a manufactured or produced product or service. Non-limiting examples of products or services include articles of manufacture, prototypes, software products, software-as-a-service, and the like. A project may encompass a set of products or services, including those in their development and deployed phases of lifecycle. Notably, in the development phase of a project, MBSE can provide an important framework for such quality controls as ensuring that design requirements are met, and that the performance and reliability of each use case of the product or service is proven through carrying out of a corresponding test case.

Some embodiments are directed to linking portions of MBSE works at the granularity level of a section, clause, or provision, of the MBSE works. For the sake of brevity, these types of portions are referred to as statements. A statement is a portion of a MBSE work that is distinctly identifiable within the MBSE work. Given the wide variety of types of MBSE works that may be processed, statements may likewise have substantial variation. Examples of statements include text under a heading or sub-heading, text in a paragraph, text in a sentence, text in a bullet point, text in a table cell, text in a table row, text in a table column, text in a table, text in a figure caption, a textual callout or label of a diagram, an activity name, a textual name of a component of a CAD model, text appearing as a note, footnote, or comment, or the like.

Related embodiments may examine statements within a single MBSE work (in addition to examining statements across different types of MBSE works) to measure similarity or differences among or between statements to produce a statement-grouping determination. Other related embodiments may select or determine statement-delineation criteria based on a heuristic algorithm that considers document type, structure, and formatting indicia.

In establishing linkages between MBSE works, portions, or statements, of the MBSE works are compared with one another. Although there are many known techniques for comparing and finding similarity between documents or data objects, automated analysis operations of MBSE works by computational systems present a special set of challenges. For example, each statement of MBSE models, documents, or other MBSE works, may be linked to multiple other statements of MBSE works, whether from the same MBSE work, or across different MBSE works. Conventionally, whenever a given statement of a MBSE work is changed, all of the linked portions or statements of the same, or different, MBSE works, are called up and updated (or subjected to review for change management) in response to the change to the given portion. In a large MBSE project having many works and many ongoing revisions or other changes, the sheer number of linkages and ensuing propagation of changes to linked statements presents a substantial computational burden.

Aspects of the embodiments are directed to a computational accelerator system for facilitating change management of works in a MBSE regime. The system includes a MBSE work preprocessor that operates autonomously on MBSE works to produce a first preprocessed data structure representing a first MBSE work and a second preprocessed data structure representing a second MBSE work. The MBSE work preprocessor delineates the respective content of each MBSE work into segments corresponding to separately identifiable statements of that MBSE work, and performs a segment-wise comparison between segment pairings of the first preprocessed data structure and the second preprocessed data structure to produce a set of statement-wise comparison results based on content similarity among each segment pairing.

Further, the MBSE work preprocessor autonomously determines statement-wise, variable-strength linkages between statements of the first MBSE work and the second MBSE work based on the set of segment-wise comparison results. The statement-wise, variable-strength linkages may be stored as a linkage set data structure that includes associations between certain statements across the first MBSE work and the second MBSE work, and indicates measures of linkage strength corresponding to the associations.

The linkage strength may represent a similarity score, which may be a numerical value on a defined scale with a maximum value. The linkage strength may be represented as a similarity ratio (e.g., 1.00 indicating identity, and fractional values indicating a measure of similarity). In related embodiments, the linkage strength may be an assigned categorization from among a finite set of categories (e.g., low, medium, high).

In a related aspect, the linkage strength may represent various linkage attributes, some of which may be statement similarity-related, while other attributes represent a change-management prioritization. According to various embodiments, the variable-strength linkages may be represented as scalar values, or as multi-dimensional values corresponding to a plurality of attributes on which the linkage strength is based.

Various criteria may be taken into account in generating the change-management prioritization. These may include, for example, a time duration or iteration count since the last update following a detected change to a MBSE work's statement, a prioritization categorization based on type of MBSE work(s)—which may take into account the type of the changed MBSE work, the type of linked MBSE work subject to review for change management, or both, according to various embodiments. Thus, for instance, if a statement in a design requirements document is changed, a link to a statement in a testing procedure document for verifying the design may be designated as a relatively high-priority linkage.

In another related aspect, linkages between statements of MBSE works may be directional. Directionality of linkages in the present context relates to the direction of change propagation. Thus, for instance, given statement A is linked to statement B, a detected change in statement A may call for a responsive update to statement B (linkage A→B). Similarly, a detected change in statement B may call for an update of statement A (linkage B→A). According to this aspect of the embodiments, the strength of linkages may take into account their respective directionality. To illustrate, expanding on the aforementioned example of the statement in the design requirements document linked to the statement in the testing procedure document, a first-direction linkage of (design requirement document's statement→testing procedure statement) may be designated as a relatively high-priority linkage, while the second-direction linkage between the same statements (testing procedure statement→design requirement document's statement) may be designated as a relatively low-priority linkage.

A related aspect of the embodiments is directed to a revision control engine that is part of the computational accelerator system. The revision control engine operates to selectively indicate a call for revision of a second statement of the second MBSE work in response to a detected change in an associated first statement of the first MBSE work, and based on an operational condition of the MBSE system (e.g., computational load, network congestion, etc.). The revision control engine implements a change prioritization process to determine the call for revision based on a linkage strength corresponding to the linkage between the first statement and the second statement.

For example, in response to a detected change to a first statement of a given MBSE work, the linkage strength may be compared against revision criteria (e.g., a change-propagation threshold) before any linked MBSE-work statement is updated. Lower-strength links (e.g., having a strength indicator below a defined change-propagation threshold) may be ignored from the change-propagation cycle if the change-propagation threshold is not met. For example, in a situation where an operational condition of the MBSE system has a high computational load (e.g., in excess of a defined loading threshold), the change-propagation thresholding may be applied. In a related example, when the MBSE system operates at a low computational load (e.g., below the loading threshold), the change-propagation thresholding operation may be omitted.

The computational load may be determined based on any suitable system monitoring technique, including processor core idle time, system memory bus or memory controller utilization, system cache utilization, network traffic, number of active threads. The change-propagation threshold, according to some embodiments, is a reference value representing a required level of change prioritization assigned to a given linkage between a changed MBSE work and a linked MBSE work subject to being updated in response to the change.

In some embodiments, the change-propagation threshold is variable according to the prevailing operational conditions. For example, in one embodiment, the change-propagation threshold is a function of the measured computational load. Thus, per this example, the revision control engine responds to a measured increase in the computational load by commensurately raising the change-propagation threshold. As a result, the system is made more selective as to which linkages are serviced with a revision. In particular, with increasing computational loading, only those linkages with the greatest change prioritization are updated, and the relatively lower-priority linkages are ignored.

In a related aspect of the embodiments, the linkage strength value is adjusted based on the history of updates of the linked MBSE work statements. In one such approach, if a change in the first MBSE work statement has been detected, but particular linkage strength fails to meet the change-propagation threshold such that the second MBSE work statement is not updated, the linkage's strength indicator is increased. This feature tends to prevent lower-priority linkages from being ignored over time or over many revision cycles.

In another related aspect of the embodiments, the revision control engine performs change impact assessment to compute a change-impact score that represents a measure of the extent of the change of the first statement. In response to a change in the first MBSE work statement, the revision control engine determines the call for revision of the linked second statement based on the change-impact score.

In an example, the change impact score may be compared against a change-extent threshold. Changes in the first MBSE work statement not significant enough to meet the change-extent threshold may be ignored for the current change detection cycle.

According to various embodiments, the implementation of the change-impact scoring and change-extent threshold comparison may be performed alongside, or in place of, the variable-strength linkage assessment. As an example, the change-impact scoring and change threshold comparison may be performed selectively, such as during high computational load states of the MBSE system.

In a related embodiment, the change-impact scoring is used as an attribute in determining or adjusting the strength of a linkage. In this approach, the change impact score is assessed in response to a detected change in the first MBSE work's statement. This change impact score may be applied to increase or discount the strength of all linkages from the first MBSE work. In various examples, the change impact score may be the sole attribute that defines the strength of those linkages, or it may be one of a plurality of attributes defining the strength of those linkages.

Advantageously, aspects of the embodiments achieve improved computational performance of an automated MBSE system by tracking changes that have impact, and causing change propagation of MBSE work updates only for the changes in linked MBSE works that have impact. Thus, users of the MBSE system incorporating some aspects of the technology described herein have the benefit of improved system responsiveness while being assured that changes that have impact are propagated.

Aspects of the embodiments may be implemented as part of a computing platform. FIG. 1A is a high-level system diagram illustrating a machine implementation of a computational accelerator system for determining linkages across a diverse set of works according to some embodiments. Computational accelerator system 100 includes execution circuitry 102, such as one or more processors, memory, system interconnects, and the like, examples of which are described in greater detail below. Program instructions 104 are stored on a tangible, non-transitory, storage medium, such as a memory device, non-volatile memory, hard drive, solid-state drive, or the like, which is interfaced with execution circuitry 102. Input/output facilities 106 are interfaced with execution circuitry 102, and are configured to facilitate the transmission of information from and to computational accelerator system 100.

When executed by the execution circuitry 102, program instructions 104 create a special-purpose machine that embodies computational accelerator system 100. It may be one physical machine, or may be distributed among multiple physical machines, such as by role or function, or by process thread in the case of a cloud computing distributed model. In various embodiments, aspects of the invention may be configured to run in virtual machines that in turn are executed on one or more physical machines. It will be understood by persons of skill in the art that features of the invention may be realized by a variety of different suitable machine implementations.

MBSE works 108A and 108B are each stored in a respective tangible storage medium as a file, collection of files, database, or other data structure, and accessible by system 100 via input/output facilities 106. User interface 110 is also interfaced with system 100 via input/output facilities 106. User interface 110 may be hosted on the same machine as system 100, or it may be hosted on a remote device that is communicatively coupled to system 100 via a data-communication network. In various embodiments, system 100 reads MBSE works 108A, 108B, processes their contents to determine linkages between them, and presents the determinations to user interface 110. The determinations of linkages may be presented as computed assessments, or as computed recommendations, with the latter being subject to review and approval by a user.

Figure 1B:
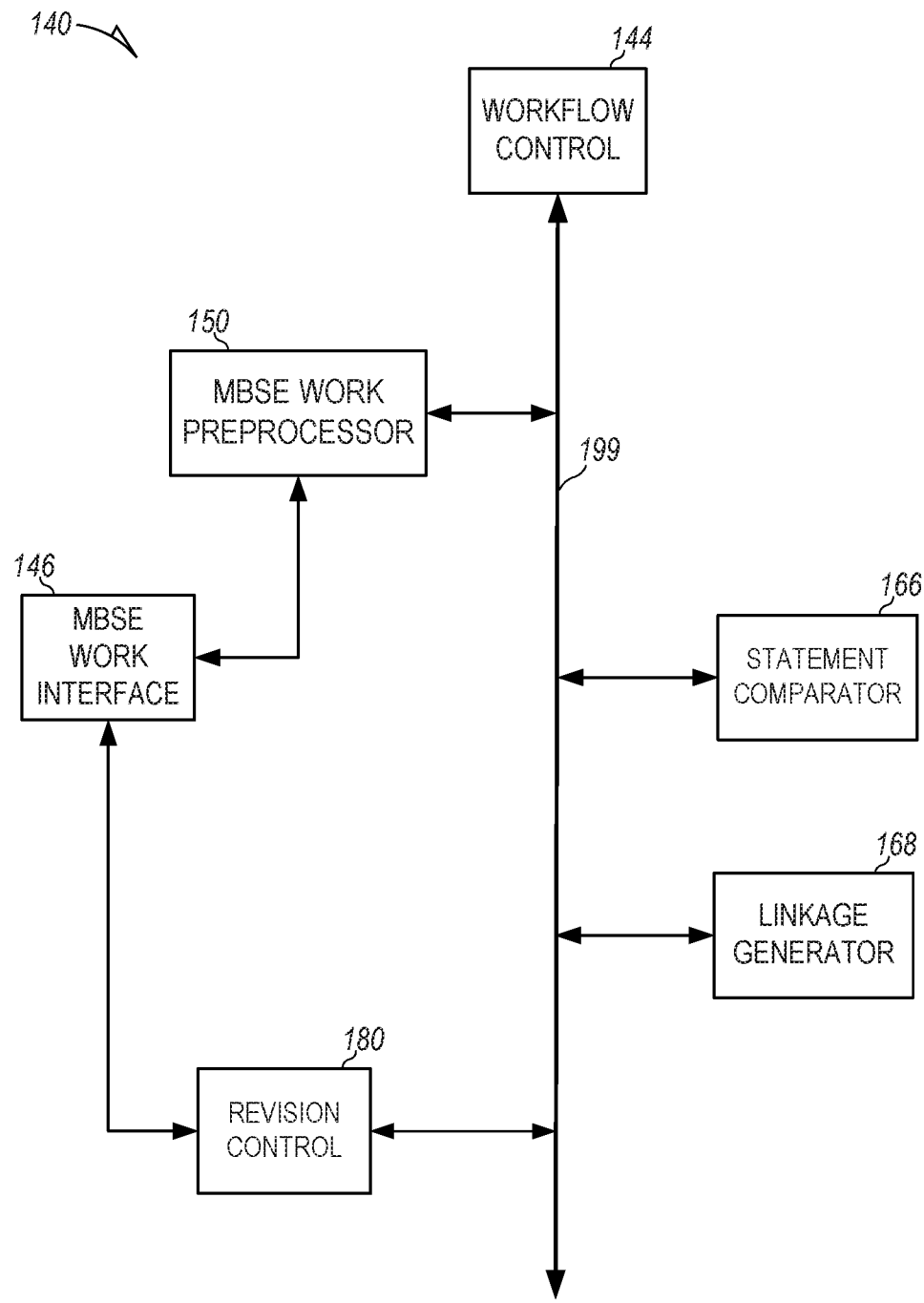
FIG. 1B is a block diagram illustrating an example system architecture of a special-purpose machine that is instantiated when processing circuitry executes program instructions to create a special-purpose machine that embodies a computational accelerator system.

FIG. 1B is a block diagram illustrating an example system architecture 140 of a special-purpose machine that is instantiated when execution circuitry 102 executes program instructions 104 to create a special-purpose machine that embodies computational accelerator system 100 according to an example embodiment. As depicted in FIG. 1B, computational accelerator system 100, may be realized as a set of components, circuits, or engines, which for the sake of consistency are termed engines, although it will be understood that these terms may be used interchangeably. Engines are hardware implements (which may be controlled by software or firmware executed on one or more processors) in order to carry out a corresponding operation or set of operations. Engines are tangible entities capable of performing specified operations and may be configured or arranged in a certain manner. In an example, circuits may be arranged (e.g., internally or with respect to external entities such as other circuits) in a specified manner as an engine. In an example, the whole or part of one or more computing platforms (e.g., a standalone, client or server computing platform) or one or more hardware processors may be configured by firmware or software (e.g., instructions, an application portion, or an application) as an engine that operates to perform specified operations. In an example, the software that, when executed instantiates an engine, may reside on a machine-readable medium. In an example, the software, when executed by the underlying hardware of the engine, causes the hardware to perform the specified operations. Accordingly, the term hardware engine is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. As shown in FIG. 1B, a bus 199 connects the workflow control 144, the MBSE work preprocessor 150, the statement comparator 166, the linkage generator 168, and the revision control 180.

Considering examples in which engines are temporarily configured, each of the engines need not be instantiated at any one moment in time. For example, where the engines comprise a general-purpose hardware processor configured using software; the general-purpose hardware processor may be configured as respective different engines at different times. Software may accordingly configure a hardware processor, for example, to constitute a particular engine at one instance of time and to constitute a different engine at a different instance of time.

System architecture 140 includes workflow control engine 144 that is configured to coordinate the operation and interoperability of engines 150 and 166-180 to carry out the functionality of computational accelerator system 100. The operation of workflow control engine 144 is described in greater detail below in connection with FIG. 5.

MBSE work interface engine 146 is configured to access individual MBSE works that may be stored in a file system, for example. In related embodiments, MBSE work interface 146 includes one or more access-control provisions to facilitate accessing MBSE works that are secured, such as via cryptography, access credential, or other suitable means. In a related example, MBSE work interface engine 146 is configured to convert certain MBSE document types into a different format, or to import (e.g., selectively copy a subset of the content) from certain types of MBSE works. For example, graphical MBSE works such as engineering drawings or diagrams may be imported as text documents.

MBSE work preprocessor 150 operates to transform MBSE works into data structures that facilitate statement-wise comparison operations to be performed by statement comparator engine 166, with improved efficiency (e.g., requiring fewer computational operations), while achieving higher-sensitivity comparisons, than conventional textual or linguistic comparison operations applied to disparate MBSE works (e.g., having substantially different textual volume and densities, grammatical structure, etc.).

Statement comparator engine 166 is configured to compare MBSE works that have been preprocessed by MBSE work preprocessor 150, in statement-by-statement fashion. As part of the statement-wise comparison, a measure of similarity between each pair of compared statements may be produced as a comparison result. As an example, term matches (i.e., hits count) may be totalized and a segment comparison score may be computed based on the hits count value. Statement comparator engine 166 may additionally apply weighting criteria for statements from MBSE works having weighted terms. For example, terms having similar weighting among statements from the MBSE works being compared may be associated with a bonus score to elevate the measure of similarity. Statement comparator engine 166 may store each statement-wise comparison result as a part of a set of statement-wise comparison results that is stored as a data structure in a physical medium associated with the MBSE works and statements having been compared.

The set of statement-wise comparison results may be bound to each of the MBSE works. In one such example, the set of statement-wise comparison results may be appended to each of the MBSE works with which the comparison results set is associated. In another example, the set of statement-wise comparison results may be stored in one or more data structures that are separate from the MBSE works themselves, and an association between the set of statement-wise comparison results and the MBSE works may be stored as a data structure, or portion of a data structure (e.g., a database record), in a physical storage medium.

Linkage generator engine 168 is configured to assess whether any linkage is to be created between segments of MBSE works being compared. As discussed above, a linkage is an indicator representing the presence of related content across MBSE works, as well as identifying which particular statements relate to one another. As an example, linkage generator 168 may compare the measure of similarity produced by statement comparator engine 166 against a linkage-generation threshold value. The linkage-generation threshold value may be predefined by a user or autonomously by linkage generator engine 168. In related examples, the linkage-generation threshold may be user-variable or autonomously adaptively variable. In response to a given measure of similarity between compared segments meeting or exceeding the link-generation threshold, linkage generator engine 168 creates and stores a corresponding linkage associated with those segments in a suitable data structure in memory, such as a table, database, extensible markup language (XML) file, or the like.

As a result of its operation, linkage generator engine 168 may produce a linkage set data structure that identifies each segment of each MBSE work, and lists the other segments of other MBSE works with which linkages have been created, along with any applicable linkage strength (e.g., scalar or vector representation for single/multiple attributes), and linkage directionality, if the latter is supported in the implementation of linkage generator engine 168. As discussed above, the linkage strength (per linkage direction, if applicable) may be based on a variety of criteria, such as a time duration or iteration count since the last update following a detected change to a MBSE work's statement, a prioritization categorization based on type of MBSE work(s), or other criteria.

The linkage set data structure may be stored in a physical medium of a computing platform. For instance, the linkage set data structure may be stored as a database or lookup table. In another example, the linkage set data structure may be distributed as a set of data structures corresponding to individual MBSE works. For instance, portions of the linkage set data structure may be appended to corresponding MBSE works to which those portions refer. In a related example, the linkage set data structure may be used to generate a linkage report that is formatted for interpretation by users.

Revision control engine 180 is configured to detect changes made to a given statement of a MBSE work, to monitor operational conditions of the MBSE system (e.g., computational loading, network congestion, etc.) and, based on the change occurrence, the operational conditions, the applicable linkage strength, and change-propagation criteria (e.g., change-propagation threshold), to determine whether any other statement of the same, or other, MBSE work(s) that are linked to the changed statement should be updated in response to the change to the given statement.

In a related embodiment, revision control engine 180 tracks whether revision of a second MBSE work's statement was called for in response to a detected change in a linked first MBSE work section, and maintains and updates a change history log that represents an occurrence of a change in a MBSE work's statement, and whether a call to update any of the linked MBSE work statement(s) was made, or whether the change was ignored for change-propagation purposes in any given change instance. This history-log information may be passed to linkage generator engine 168, which in turn may adjust the linkage scoring.

In a related embodiment, revision control engine 180 performs change impact assessment to compute a change-impact score, as described above. With the change-impact score, revision control engine 180 may determine the call for revision propagation to the linked second statement based on the change-impact score, or use the change-impact score to adjust the linkage strength of the linkages associated with the changed MBSE work statement.

Figure 1C:
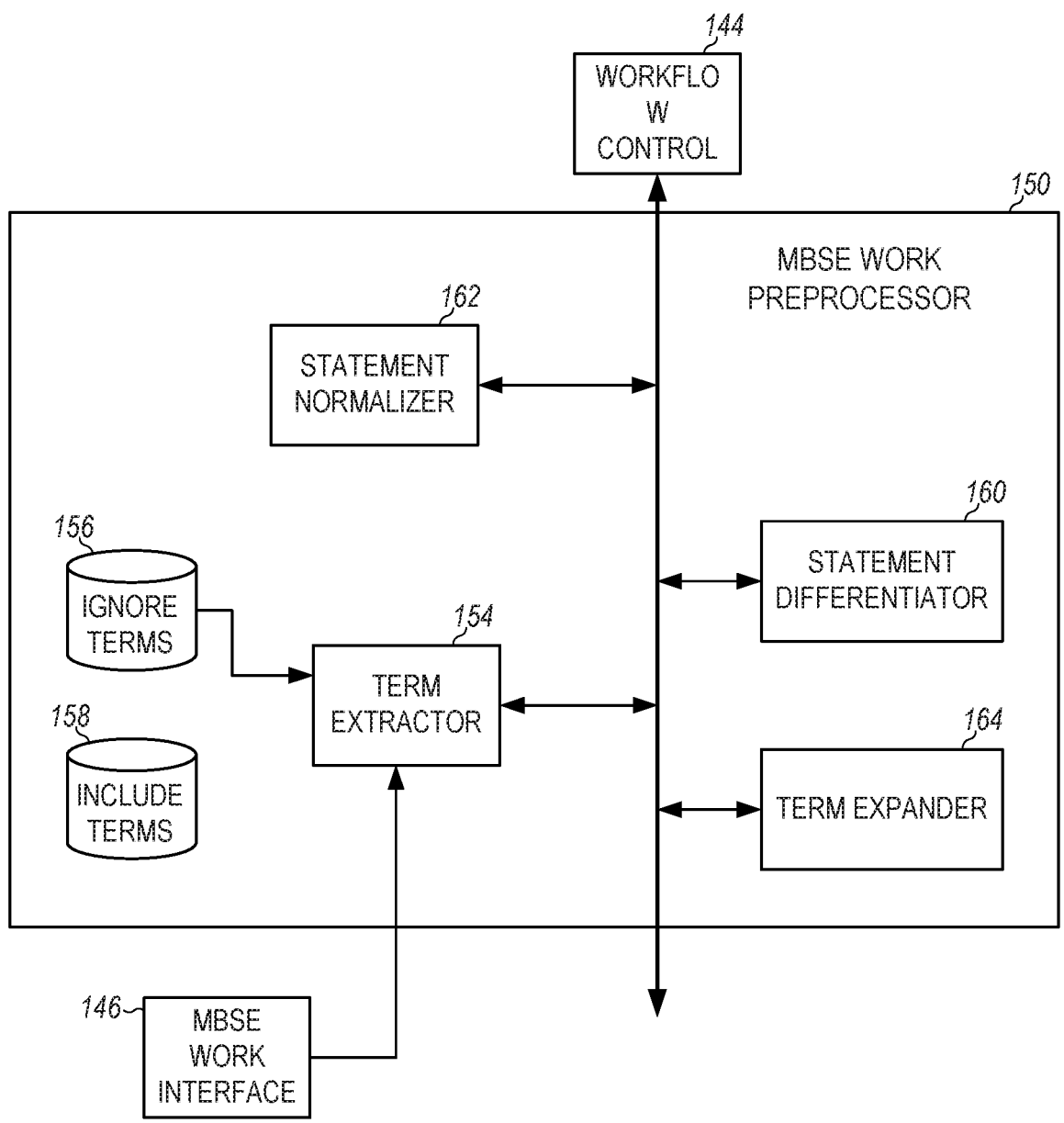
FIG. 1C is a block diagram illustrating example architecture of an MBSE work preprocessor engine of the computational accelerator system of FIG. 1B according to an example embodiment.

FIG. 1C is a block diagram illustrating the architecture MBSE work preprocessor engine 150 in greater detail according to an example embodiment. Term extractor engine 154 is configured to gather (e.g., copy, isolate, tag, or otherwise set apart) significant terms appearing in MBSE documents, based on optional ignore terms data set 156 and optional include terms data set 158. The optional terms might not be included in some embodiments of the preprocessing. Term extractor engine 154 operates on the imported MBSE work that is stored as the output of the operation of term extractor engine 154. Ignore terms data set 156 is a data structure stored in a physical medium that includes terms that have been deemed as having a tendency to de-sensitize decision logic that functions to discriminate between statements and the strength of statement comparisons across MBSE works. Include terms data set 158 includes important individual words, hyphenated compound words, or terms of art containing stop words, for instance, that may not otherwise be discovered by a noun phrase extraction operation. As an example, operation of term extractor engine 154 on a given MBSE work produces an extracted-term data structure, such as a list, a database, a file in ASCII or other text format, a file in an XML file format, or the like, representing that MBSE work, with non-significant terms omitted.

Statement differentiator engine 160 is configured to operate on the output of term extractor engine 154 to further process each MBSE work to produce intra-MBSE work statement segmentation. Statement segmentation involves determining which terms are to be grouped as statements. Statement differentiator engine 160 includes decision criteria that may be specific to MBSE work type. Thus, for example, different types of MBSE works may have different corresponding statement-differentiation decision criteria applied. As an example, statement differentiator engine 160 may process a MBSE work that is primarily textual in its content by utilizing punctuation cues as primary delimiters of statements.

According to various examples of statement-differentiation criteria, text that appears within a sentence, a paragraph, or a subheading, in the MBSE work, may be grouped as a single statement. In the case of processing a MBSE work that is primarily graphical in its content, statement differentiator engine 160 may use the relative positioning of text items, or spacing there between, as primary delimiters of statements. In another example, text associated with lead lines or arrows pointing to closely-coupled diagrammatic features may be grouped as a statement. As an example, the output of statement differentiator engine 160 may be a segmented data structure, such as a list, a database, a file in ASCII or other text format, an XML file, or the like, representing that MBSE work, with its content segmented as statements. The statements may be set apart using tags, field codes, delimiters, spacing, or punctuation, for instance, according to various examples. In a related example, each statement may have an index or other identifier associated with it within the segmented data structure.

Statement normalizer engine 162 is configured to operate on the output of statement differentiator engine 160 to apply a set of normalization criteria to each statement of a given MBSE work. Application of the normalization criteria de-sensitizes the term comparison operations from any variation in grammar, such as tenses, word forms, grammatical inflections, and the like, across MBSE works, which operates to relieve any bias that may be imparted on the term comparison operations due to the size, quantity, and grammatical properties of a given statement. For instance, terms that appear multiple times in a statement may tend to bias a statement comparison result by appearing to produce a deceptively high measure of similarity in some cases due to a greater hit count attributable to the same term. This deceptively high comparison measure may be contrasted with a statement comparison that produces multiple hits from different terms present across the statements being compared, which is a more meaningful similarity score in some cases.

Accordingly, in some embodiments, statement normalizer engine 162 includes duplicate term removal logic to remove repeated instances of terms from statements within a given MBSE work. Notably, statement normalizer 162 operates at the statement level, such that multiple instances of a term are permitted within a MBSE work. In a related example, statement normalizer engine 162 adds a weight to repeated terms within a statement to indicate the term's prevalence within the statement. The weight may represent a ratio of the number of instances of the repeated term to the total number of words in the statement, for example.

Statement normalizer engine 162 may further include logic to remove numerals, remove spelled-out numbers, standardize alternative spellings of terms, and remove or standardize grammatical inflections, such as verb conjugations, prefixes, suffixes, and plurals of terms. As a result of its operation, statement normalizer engine 162 produces a normalized data structure representing a given MBSE work, with statements segmented in a suitable fashion as described above, for example, with various features omitted, such as duplicate terms at the statement level, numerals, etc., and may include added tags or other indicia representing the relative weights of certain terms.

Term expander engine 164 is configured to operate on the output of statement normalizer engine 162 to tokenize each statement within of the MBSE work according to logic that defines the tokenization format, perform synonym expansion of the terms in each statement according to a predefined synonym set, and perform alternative acronym expansion of any acronyms appearing in statements of the MBSE work being processed based on a predefined list of acronym cross-references, according to an example embodiment. An example of the result of the operation of term expander engine 164 is one or more data structures representing the MBSE work, with tokenized sets of structured data representing each statement of the MBSE work. For each term of each statement of the MBSE work, the output of term expander engine 164 may include added synonym terms, and added alternative acronyms to provide a larger set.

Figure 1D:
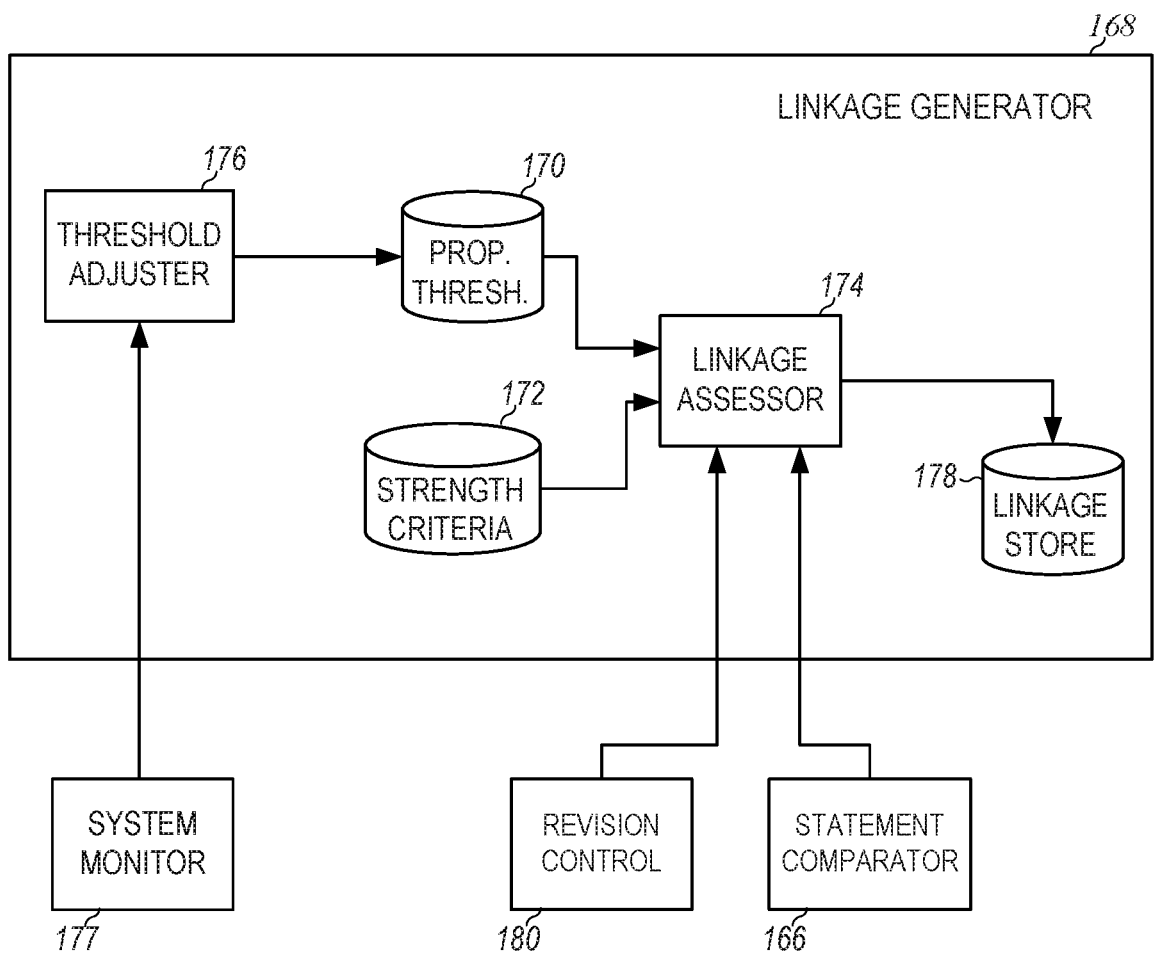
FIG. 1D is a block diagram illustrating an example architecture of a linkage generator of the computational accelerator system of FIG. 1B according to an example.

FIG. 1D is a block diagram illustrating an example architecture of linkage generator 168 according to an example. Linkage generator 168 stores change-propagation threshold data 170, and linkage strength determining criteria data 172, each of which is accessed by linkage assessor engine 174.

Change-propagation threshold data 170 represents a current linkage-creation threshold for creating a linkage between statements. The change-propagation threshold data 170 may be fixed or adjustable. In embodiments having an adjustable linkage threshold, threshold adjuster engine 176 sets the threshold based on the MBSE system's operational conditions (e.g., computational loading, network congestion, etc.) as measured by system monitor 177.

Linkage strength determining criteria data 172 identifies the attributes, formulas, and algorithm for determining the linkage strength. Linkage assessor engine 174 uses linkage strength determining criteria data 172 to appraise the strength of each linkage according to one or more of the examples described above.

Linkage assessor engine 174 reads the output of statement comparator 166, which represents a degree of similarity between MBSE work statements, and applies change-propagation threshold data 170. If the extent of similarity meets or exceeds the current linkage-creation threshold, linkage assessor generates a linkage indicator and stores it as a suitable data structure such as a table, database, XML file, or the like, in linkage store 178. Linkage data store 178 may store the generated linkage as part of the linkage set data structure described above.

In some embodiments, linkage assessor engine 174 performs the strength determination by applying strength criteria 172 only when the linkage threshold is met. In some embodiments that take into account linkage directionality, linkage assessor generates multiple linkage strength assessments respectively for the multiple directional linkages between two given MBSE work statements. In related embodiments that base the linkage strength assessment at least in part on the change-impact scoring, linkage assessor engine 174 reads the change-impact score determined for a MBSE work statement provided by revision control engine 180 and incorporates this value into the linkage score determination.

Figure 1E:
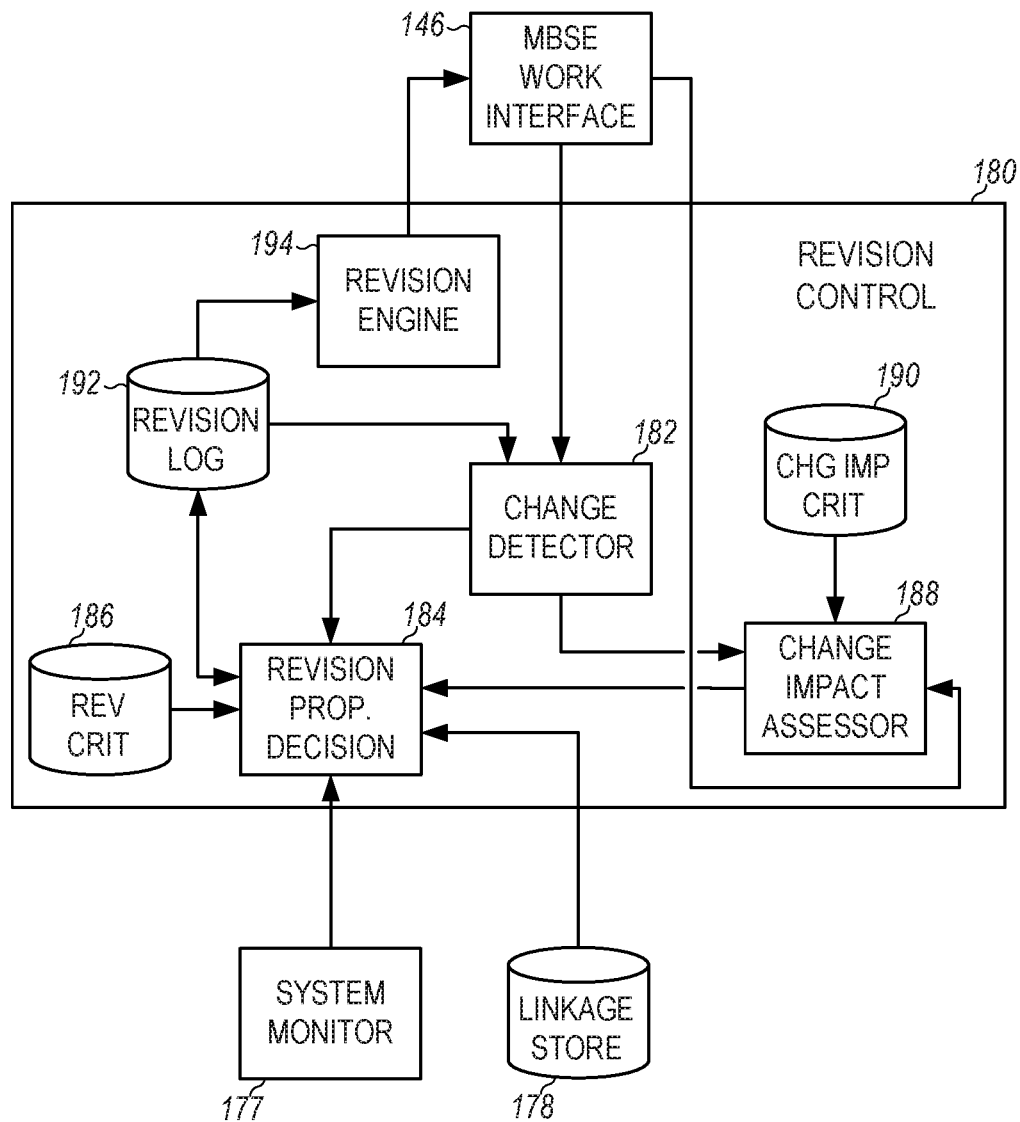
FIG. 1E is a block diagram illustrating an example of a revision control engine of the computational accelerator system of FIG. 1B according to some embodiments.

FIG. 1E is a block diagram illustrating revision control engine 180 in greater detail according to some embodiments. As illustrated, revision control engine 180 includes change detector engine 182, which reads attributes of the MBSE works via MBSE work interface, such as the date and time of the most recent modification. In some embodiments, change detector 182 scans for changes among the MBSE works of the project periodically at a defined interval. In other embodiments, change detector engine 182 scans the MBSE works of the project continuously. From the perspective of an individual MBSE work, any changes to that work are re-checked at a fixed or variable interval according to these embodiments. Each fixed or variable interval that a given MBSE work is checked for changes may be considered to be a change propagation cycle. Thus, each change propagation cycle presents an opportunity for any changes to a MBSE work statement to be propagated to linked MBSE work statements.

Change detector engine 182 also reads revision log 192, which contains records of previously-changed MBSE work statements and whether those changes were propagated. Thus, in a given change propagation cycle, change detector 182 may indicate either a new change to a MBSE work statement, or an existing but un-propagated change to that statement.

Revision propagation decision engine 184 receives an indicator of a change to a MBSE work statement from change detector 182, and determines whether that change should be propagated in the current change propagation cycle. To this end, revision propagation decision engine 184 reads linkage store 178 to determine which linkages exist for the given MBSE work statement, and reads an operational state of the system, as provided by system monitor engine 177. In addition, revision propagation decision engine 184 reads revision criteria 186, which establishes the considerations to be made and any applicable thresholds to be applied in determining whether to propagate a given change. As described above, in one example scenario when the system performance is unencumbered, revision criteria 186 may permit the changes to be propagated to all applicable linkages. However, when the computational load is significant (significance being defined by revision criteria 186), the strength of linkages, as available from linkage store 178 may be taken into account, such that relatively lower-strength linkages may be passed over in the current change propagation cycle. Un-revised linked MBSE work statements and their linkages are indicated in revision log 192, which may also indicate the number of change propagation cycles since that statement was revised in accordance with the relevant linkage.

In embodiments that utilize change impact assessment, change impact assessor engine 188 is provided as illustrated. Change impact assessor engine 188 reads the contents of a MBSE work statement and assesses the extent of changes made, based on change impact assessment criteria 190, to produce a change-impact score, which is to be accessed by revision propagation decision engine 184. In turn, revision propagation decision engine 184 may base its determination of whether to propagate a given change, at least in part, on the change-impact score.

Revision engine 194 facilitates any called-for revisions to MBSE work statements that are to be revised based on the decisions of revision propagation decision engine 184. Facilitation of the called-for revisions may include automated, or semi-automated operation. In the former, revision engine 194 executes the revisions according to a suitable revision algorithm (not shown), which may be specific to the type of MBSE work. In the semi-automated operation, revision engine 194 may generate a revision-recommendation report to be read by a separate entity, such as a human user, who may subsequently make the ultimate decision on revision of the corresponding linked MBSE work statement, and carry out the same as deemed appropriate.

Figure 2:
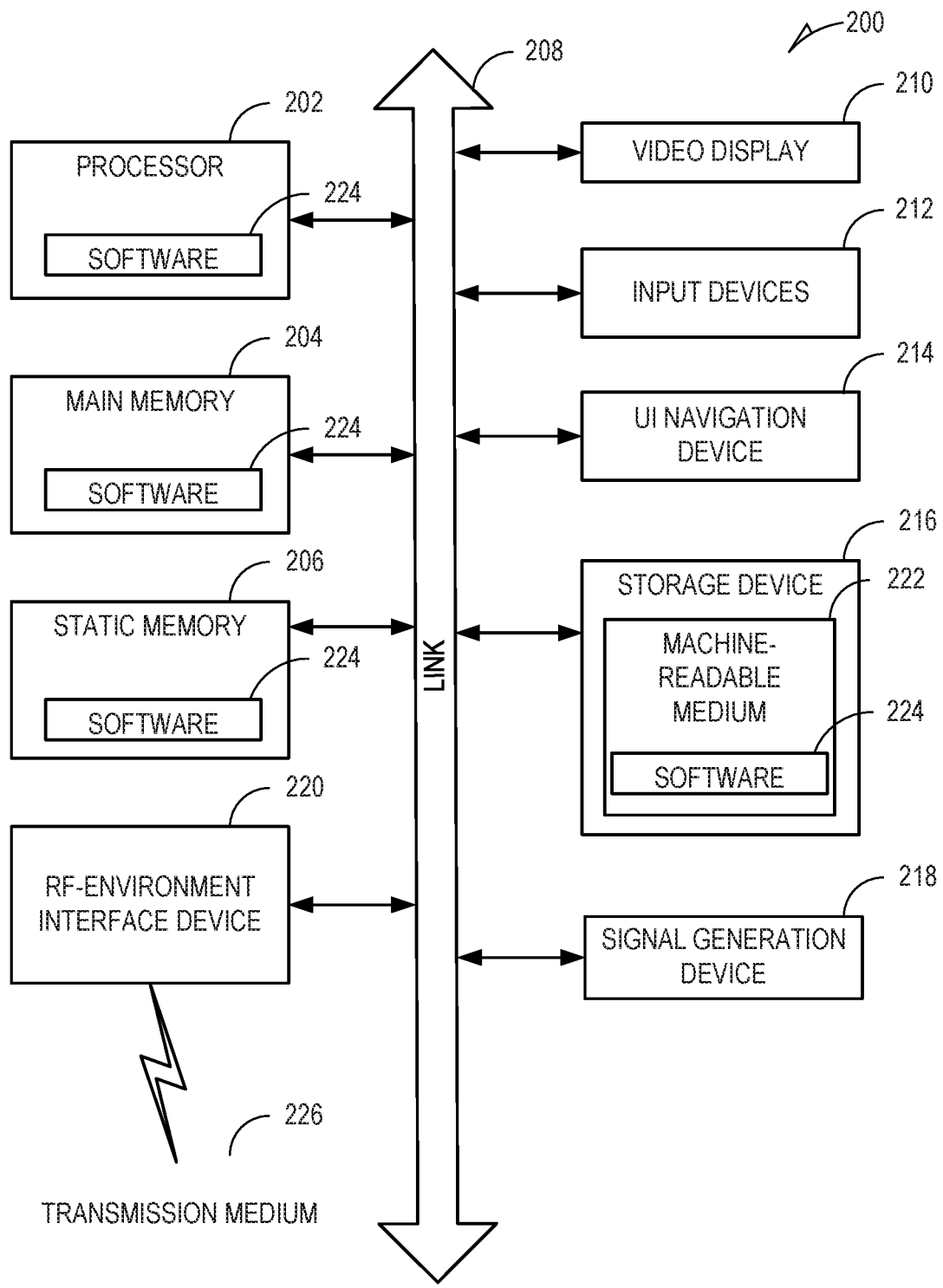
FIG. 2 is a block diagram illustrating a computing platform in the example form of a general-purpose machine, on which the system of FIG. 1 may be carried out.

FIG. 2 is a block diagram illustrating a computing platform 200 in the example form of a general-purpose machine that may be transformed into a special purpose apparatus when system 100 of FIG. 1A having example system architecture 140 as described in connection with FIGS. 1B-1E above, is instantiated according to some embodiments. In a networked deployment, the computing platform 200 may operate in the capacity of either a server or a client machine in server-client network environments, or it may act as a peer machine in peer-to-peer (or distributed) network environments.

System 100 having example system architecture 140 according to various embodiments detailed herein provides a number of advantages to improve the performance, in terms of effectiveness for MBSE document comparison, and computational efficiency, over conventional document and workflow management solutions that may otherwise be executed on a general-purpose computing platform such as computing platform 200. For example, the operations of MBSE work preprocessor 150 create a statement-based paradigm for autonomous comparison of MBSE works. The combined operations of statement differentiator engine 160, term extractor engine 154, and statement normalizer engine 162 operate to generate data structures having content in which duplicative and non-distinguishing terms are omitted, thereby allowing the computing platform 200 to focus the computational resources for the compare operations on meaningful content, for example.

Example computing platform 200 includes at least one processor 202 (e.g., a central processing unit (CPU), a graphics processing unit (GPU) or both, processor cores, compute nodes, etc.), a main memory 204 and a static memory 206, which communicate with each other via a link 208 (e.g., bus). The computing platform 200 may further include a video display unit 210, input devices 212 (e.g., a keyboard, camera, microphone), and a user interface (UI) navigation device 214 (e.g., mouse, touchscreen). The computing platform 200 may additionally include a storage device 216 (e.g., a drive unit), a signal generation device 218 (e.g., a speaker), and a RF-environment interface device (RFEID) 220.

The storage device 216 includes a machine-readable medium 222 on which is stored one or more sets of data structures and instructions 224 (e.g., software) embodying or utilized by any one or more of the methodologies or functions described herein. The instructions 224 may also reside, completely or at least partially, within the main memory 204, static memory 206, and/or within the processor 202 during execution thereof by the computing platform 200, with the main memory 204, static memory 206, and the processor 202 also constituting machine-readable media.

While the machine-readable medium 222 is illustrated in an example embodiment to be a single medium, the term "machine-readable medium" may include a single medium or multiple media (e.g., a centralized or distributed database, and/or associated caches and servers) that store the one or more instructions 224. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

RFEID 220 includes radio receiver circuitry, along with analog-to-digital conversion circuitry, and interface circuitry to communicate via link 208 according to various embodiments. Various form factors are contemplated for RFEID 220. For instance, RFEID may be in the form of a wideband radio receiver, or scanning radio receiver, that interfaces with processor 202 via link 208. In one example, link 208 includes a PCI Express (PCIe) bus, including a slot into which the NIC form-factor may removably engage. In another embodiment, RFEID 220 includes circuitry laid out on a motherboard together with local link circuitry, processor interface circuitry, other input/output circuitry, memory circuitry, storage device and peripheral controller circuitry, and the like. In another embodiment, RFEID 220 is a peripheral that interfaces with link 208 via a peripheral input/output port such as a universal serial bus (USB) port. RFEID 220 receives RF emissions over wireless transmission medium 226. RFEID 220 may be constructed to receive RADAR signaling, radio communications signaling, unintentional emissions, or some combination of such emissions.

Figure 3:
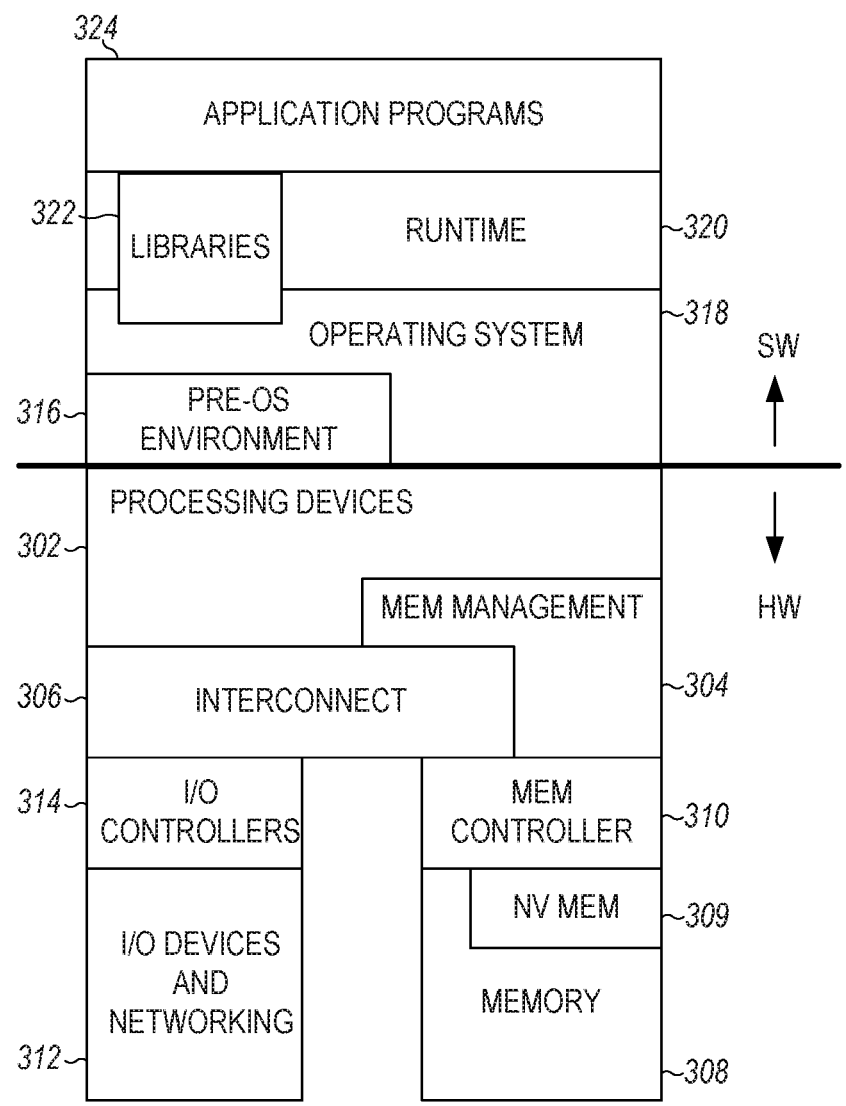
FIG. 3 is a diagram illustrating an exemplary hardware and software architecture of a computing device such as the one depicted in FIG. 2, in which various interfaces between hardware components and software components are shown.

FIG. 3 is a diagram illustrating an exemplary hardware and software architecture of a computing device in which various interfaces between hardware components and software components are shown. The example hardware and software architecture of FIG. 3 may be implemented in computing platform 200 (FIG. 2), for instance. As indicated by HW, hardware components are represented below the divider line, whereas software components denoted by SW reside above the divider line. On the hardware side, processing devices 302 (which may include one or more microprocessors, digital signal processors, etc.), each having one or more processor cores, are interfaced with memory management device 304 and system interconnect 306. Memory management device 304 provides mappings between virtual memory used by processes being executed, and the physical memory. Memory management device 304 may be an integral part of a central processing unit which also includes the processing devices 302.

Interconnect 306 includes a backplane such as memory, data, and control lines, as well as the interface with input/output devices, e.g., PCI, USB, etc. Memory 308 (e.g., dynamic random access memory or DRAM) and non-volatile memory 309 such as flash memory (e.g., electrically-erasable read-only memory such as EEPROM, NAND Flash, NOR Flash, etc.) are interfaced with memory management device 304 and interconnect 306 via memory controller 310. This architecture may support direct memory access (DMA) by peripherals in one type of embodiment. I/O devices, including video and audio adapters, non-volatile storage, external peripheral links such as USB, Bluetooth, etc., as well as network interface devices such as those communicating via Wi-Fi or LTE-family interfaces, are collectively represented as I/O devices and networking 312, which interface with interconnect 306 via corresponding I/O controllers 314.

On the software side, a pre-operating system (pre-OS) environment 316 is executed at initial system start-up and is responsible for initiating the boot-up of the operating system. One traditional example of pre-OS environment 316 is a system basic input/output system (BIOS). In present-day systems, a unified extensible firmware interface (UEFI) is implemented. Pre-OS environment 316 is responsible for initiating the launching of the operating system, but also provides an execution environment for embedded applications according to certain aspects of the invention.

Operating system (OS) 318 provides a kernel that controls the hardware devices, manages memory access for programs in memory, coordinates tasks and facilitates multi-tasking, organizes data to be stored, assigns memory space and other resources, loads program binary code into memory, initiates execution of the application program which then interacts with the user and with hardware devices, and detects and responds to various defined interrupts. Also, operating system 318 provides device drivers, and a variety of common services such as those that facilitate interfacing with peripherals and networking, that provide abstraction for application programs so that the applications do not need to be responsible for handling the details of such common operations. Operating system 318 additionally provides a graphical user interface (GUI) engine that facilitates interaction with the user via peripheral devices such as a monitor, keyboard, mouse, microphone, video camera, touchscreen, and the like.

Runtime system 320 implements portions of an execution model, including such operations as putting parameters onto the stack before a function call, the behavior of disk input/output (I/O), and parallel execution-related behaviors. Runtime system 320 may also perform support services such as type checking, debugging, or code generation and optimization.

Libraries 322 include collections of program functions that provide further abstraction for application programs. These include shared libraries and dynamic linked libraries (DLLs), for example. Libraries 322 may be integral to the operating system 318, runtime system 320, or may be added-on features, or even remotely-hosted. Libraries 322 define an application program interface (API) through which a variety of function calls may be made by application programs 324 to invoke the services provided by the operating system 318. Application programs 324 are those programs that perform useful tasks for users, beyond the tasks performed by lower-level system programs that coordinate the basis operability of the computing device itself.

Figure 4:
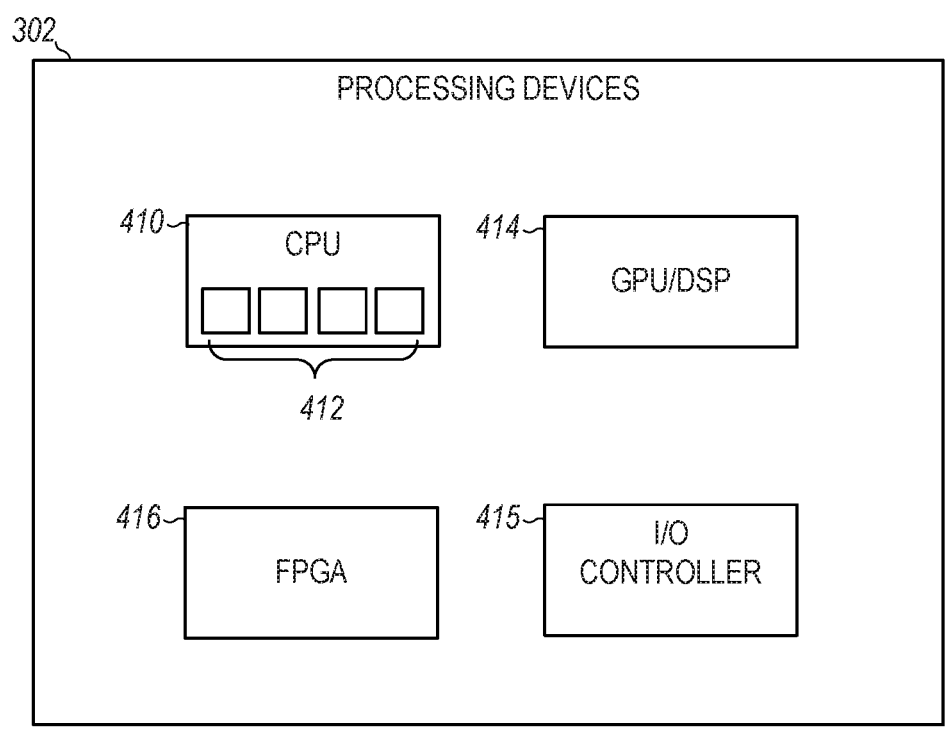
FIG. 4 is a block diagram illustrating examples of processing devices that may be implemented on a computing platform, such as the computing platform described with reference to FIGS. 2-3, according to an embodiment.

FIG. 4 is a block diagram illustrating processing devices 302 according to one type of embodiment. CPU 410 may contain one or more processing cores 412, each of which has one or more arithmetic logic units (ALU), instruction fetch unit, instruction decode unit, control unit, registers, data stack pointer, program counter, and other essential components according to the particular architecture of the processor. As an illustrative example, CPU 410 may be a x86-type of processor. Processing devices 302 may also include a graphics processing unit (GPU) or digital signal processor (DSP) 414. In these embodiments, GPU/DSP 414 may be a specialized co-processor that offloads certain computationally-intensive operations, particularly those associated with numerical computation, from CPU 410. Notably, CPU 410 and GPU/DSP 414 may work collaboratively, sharing access to memory resources, I/O channels, etc.

Processing devices 302 may also include a specialized processor 416, such a field-programmable gate array (FPGA), for example. Specialized processor 416 generally does not participate in the processing work to carry out software code as CPU 410 and GPU 414 may do. In one type of embodiment, specialized processor 416 is configured to execute time-critical operations, such as real-time, or near-real-time signal processing. Specialized processor 416 may execute dedicated firmware. Specialized processor 416 may also include a dedicated set of I/O facilities to enable it to communicate with external entities. Input/output (I/O) controller 415 coordinates information flow between the various processing devices 410, 414, 416, as well as with external circuitry, such as a system interconnect.

Figure 5:
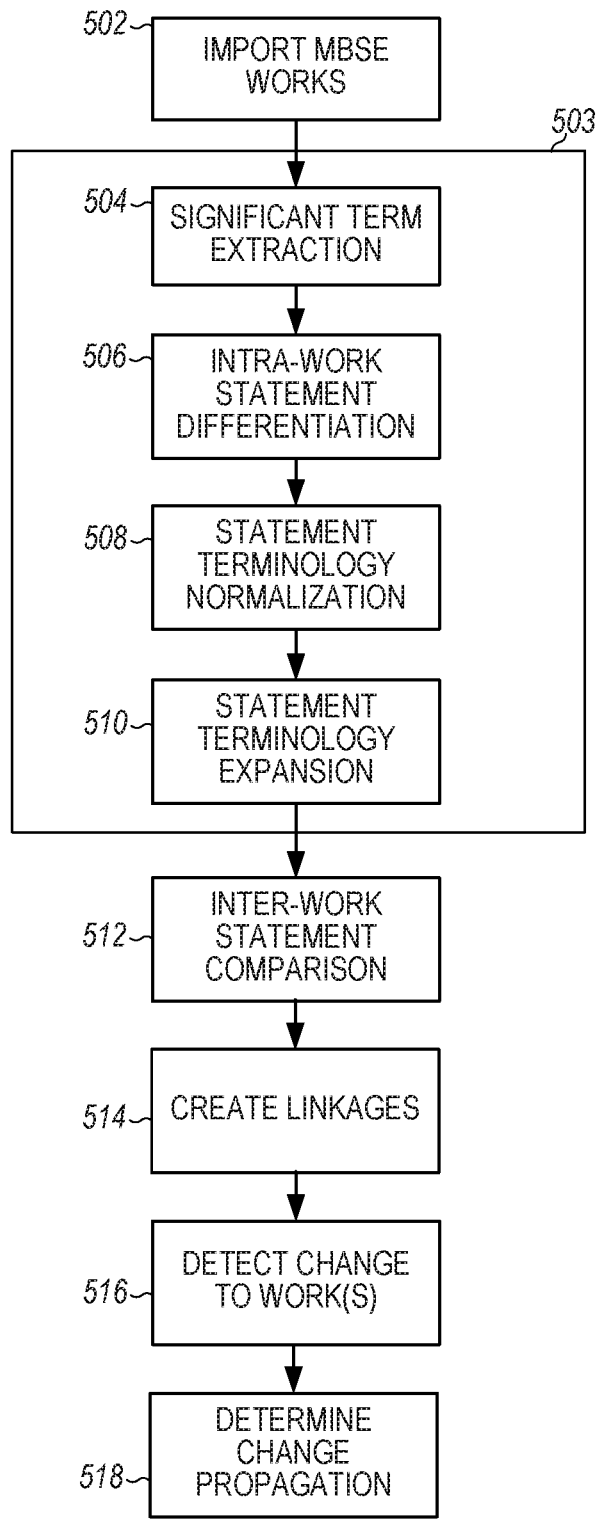
FIG. 5 is a process flow diagram illustrating a high-level operational workflow that may be carried out by a computing platform, such as the system of FIG. 1, according to some embodiments.

FIG. 5 is a process flow diagram illustrating a high-level operational workflow that may be carried out by a computing platform under program control, such as system 100 (FIG. 1A) having architecture 140 (FIGS. 1B-1E), according to some embodiments. The process is a machine-implemented process that includes autonomous operations (e.g., without user supervision), though the operation of the process may be user user-initiated, and it may feature interaction with a user in some respects. In addition, it is important to note that the process depicted in FIG. 5 is a richly-featured embodiment that may be realized as described; in addition, portions of the process may be implemented while others are omitted in various embodiments. The following Additional Notes and Examples section details various combinations, without limitation, that are contemplated. It should also be noted that in various embodiments, certain process operations may be performed in a different ordering than depicted in FIG. 5.

At 502, MBSE work interface 146 imports MBSE works into a data store for processing. The data store may be physically realized as a file in the computing platform's file system, or allocated storage space in memory, for example. The process of importation may be specific to each type of MBSE work. For instance, engineering documents, such as requirements specifications, test procedures, etc., which are primarily textual, may be imported virtually in their entirety as plain text, tabular, or tagged documents such as extensible markup language (XML) documents. Notably, certain layout or formatting indicators may be reflected in some suitable fashion, such as using field codes, tagging, or other technique, such that the imported textual MBSE work retains at least indicia of these features. Architectural models, which may be primarily visual in nature, may be imported as extracted text portions that omit graphical features, also as plain text, tabular, or tagged documents such as extensible markup language (XML) documents. In a related example, the visual spacing of text blocks may be taken into account using tables, tags, etc.

Figure 6:
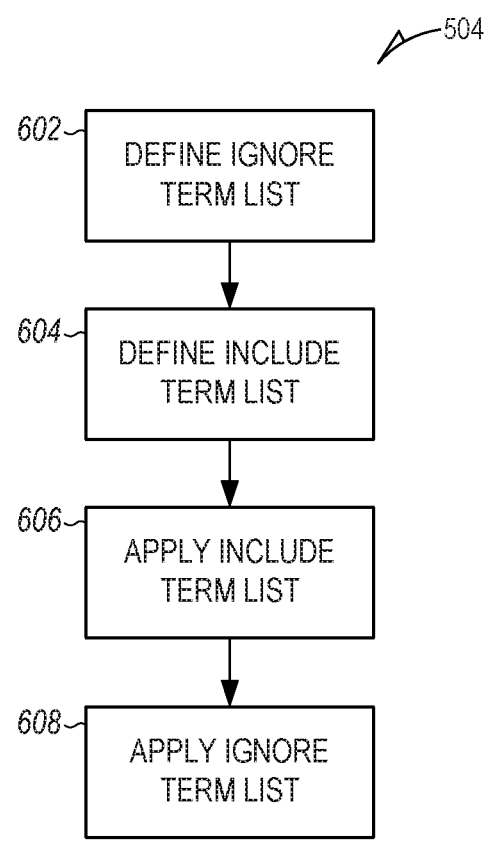
FIG. 6 is a process flow diagram illustrating significant-term extraction operations according to some embodiments.

At 503, MBSE work preprocessor 150 performs operations 504-510. At 504, term extractor engine 154 performs significant-term extraction, an example of which is described with reference to FIG. 6. FIG. 6 is a process flow diagram illustrating significant-term extraction operations according to some embodiments. At 602, the ignore term list is defined and stored in a physical medium (e.g., memory, virtual memory, file system, etc.). This operation may be performed autonomously according to some embodiments by application of decision logic. In an example, definition of the ignore term list includes automated examination of an individual MBSE work to determine if any term appears distributed throughout the work. For instance, for a project involving radio communications, the term "RF" may be found to appear throughout a given work at multiple instances, and at various locations. The presence of "RF" throughout a MBSE work tends to de-sensitize decision logic that functions to discriminate between statements and the strength of statement comparisons across MBSE works. Any suitable function, such as a heuristic function, may be applied as decision logic for assessing the ubiquity of a given term distributed throughout a MBSE work. Defining of the ignore term list may proceed term-by-term, examining the MBSE work as a whole. The ignore term list may also compile a list of pronouns, articles, conjunctions, and other parts of speech that convey little or no meaning outside of the context in which they are present.

At 604, the include term list is defined for the MBSE work. The include term list includes important individual words, hyphenated compound words, or terms of art containing stop words, for instance, that may not otherwise be discovered by a noun phrase extraction operation. In one example, the include term list may be automatically generated based on searching for regular expression patterns that occur in the corpus of MBSE works. In some examples, an n-gram analysis may be performed on the corpus and relatively longer n-grams that do not contain ignore-list terms may be selected for inclusion in the include list.

At 606, the include term list, which was previously defined, is applied to the text of the MBSE work to fix the included terms. For instance, the term "radio front end module" appearing in the MBSE work and in the include term list may be changed to radio front end module to ensure that the individual words from which this term of art is composed are not re-ordered by further processing. At 608, the ignore term list is applied to the MBSE work to remove those terms which have been identified as being insignificant.

Returning to FIG. 5, at operational block 506, statement differentiator engine 160 performs intra-MBSE work statement differentiation. This set of operations involves separately delineating the individual statements in the MBSE work to produce a data structure that indicates statement boundaries. The data structure may use tags, fields, or any other suitable delineation to indicate boundaries between statements. Any suitable statement-differentiation logic may be applied, including predefined decision-criteria or heuristic techniques. For example, in an original textual MBSE work, the punctuation, headings, subheadings, or white space may be present as delimiters between statements. Formatting indicia retained in the imported copies of these MBSE works may be utilized to differentiate one statement from the next.

Figure 7:
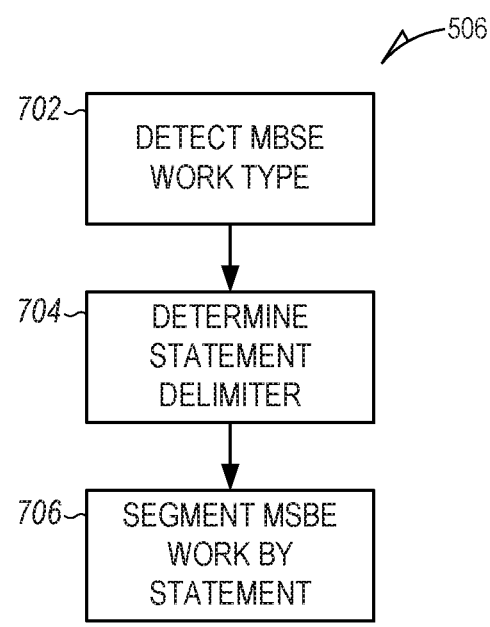
FIG. 7 is a flow diagram illustrating statement differentiation operations according to an example embodiment.

FIG. 7 is a flow diagram illustrating statement differentiation block 506 according to an example embodiment. At 702 statement differentiator 160 detects a MBSE work type. In a simple example, the MBSE work type may be indicated as part of the metadata of the MBSE work using a type indicator. The type indicator may be informative as to the nature of statement structuring in the MBSE document. In another embodiment, properties of the MBSE work may be examined and compared against MBSE type-determining criteria with which statement differentiator engine 160 is configured.

At 704, statement differentiator engine 160 determines a type-specific statement delimiter. As an example, for one type of MBSE work, punctuation may be a primary delimiter of statements; whereas in another type of MBSE work, headings or subheadings may be selected as the proper delimiter. Selection of the delimiter may be based on preconfigured selection logic in an example. In another example, the delimiter selection is based on the type of MBSE work being processed. In still another example, the delimiter selection logic may use heuristics or machine learning techniques to determine the proper delimiters to use for each particular MBSE work. For other types of MBSE works, relative groupings of terms, such as positioning on a sheet, association with various graphical elements, etc., may be used as the statement-delimiting criteria.

At 706, each MBSE work is segmented with individual statements clearly delineated. Each MBSE work may be represented as a table, database, or other suitable data structure representing a plurality of statements.

Figure 8:
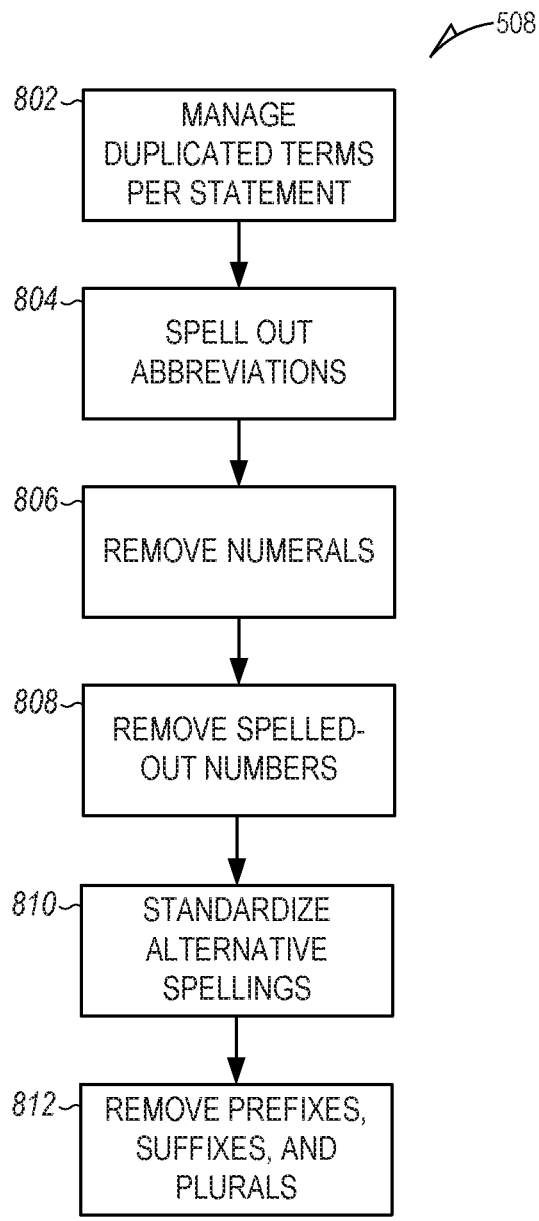
FIG. 8 is a flow diagram illustrating an example of a normalization procedure according to some embodiments.

Returning to FIG. 5, at 508, statement normalizer engine 162 normalizes statement of each MBSE work to de-sensitize the term comparison operations from any variation in grammar, such as tenses, word forms, and the like, across MBSE works, and relieve any inherent bias that may be imparted on the term comparison operations due to the size, or quantity, of a given statement. FIG. 8 is a flow diagram illustrating an example of a normalization procedure. At 802, duplicated terms appearing within the same statement are managed. Intra-statement duplicates may be omitted entirely from the statement, resulting in a non-repeating set of the various terms that are present in the statement. In a related embodiment, terms may be associated with a ratio to overall term count within the statement as part of the normalization. Thus, for instance, for a statement containing a total of 20 terms, of which there are 5 instances of a particular term, that term may be associated with ratio of 1/4.

At 804, abbreviated terms within each statement are spelled out. Abbreviations include terms such as "xfer," "Rx," etc. The abbreviations may be spelled out according to a predefined abbreviation expansion list. At 806, numerals are omitted. Similarly, at 808, spelled-out numbers, are omitted as well. At 810, terms that are susceptible to alternative spellings are normalized according to a spelling policy list. For example, terms such as "gray," "grey," "armor," "armour," "stabilize," "stabilise," etc. are standardized. At 812, term is stemmed to remove prefixes, suffixes, plurals, and other variations.

Figure 9:
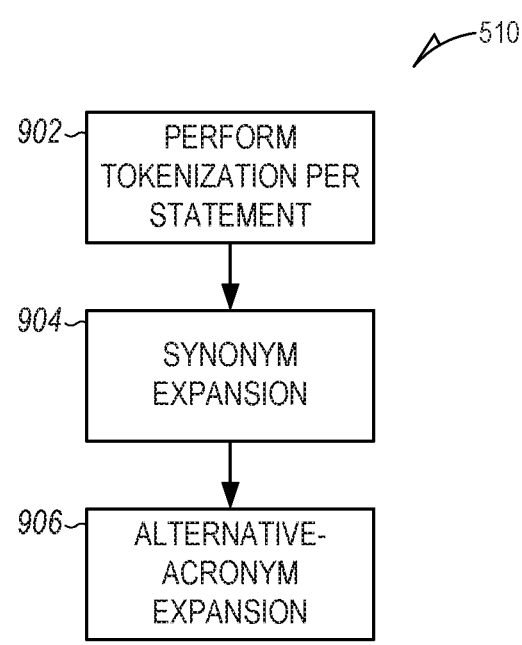
FIG. 9 is a flow diagram illustrating an example of statement terminology expansion operations according to some embodiments.

Returning again to FIG. 5, at operational block 510, term expander engine 164 performs statement terminology expansion. FIG. 9 illustrates example operations constituting block 510. At 902, tokenization is performed, per statement, to create a list, or other suitable data structure, of the significant, normalized, terms that constitute each statement. At 904, synonym expansion is performed, where each term of each statement may be replaced by a set of normalized synonymous terms, along with the original, normalized, term. At 906, acronyms may be expanded into words. In some cases, operation 906 may be skipped. The acronym expansion may be done according to a predefined acronym knowledge base.

Referring again to FIG. 5, operations 504-510, which may be considered as preprocessing operations 503 for linkage-assessment readiness, are carried out by MBSE work preprocessor 150 for each MBSE work. As an example, the result of these operations is a hierarchical representation of each MBSE work, segmented according to the constituent statements, with each segment represented by an expanded set of terms that were expanded from normalized significant terms extracted from the original statement. Optionally, the terms of each expanded set may be associated with additional indicia, such as assessed weighting indication, part of speech tag, or other indicator, which may be present in combination with one or more other additional indicators.

Figure 10:
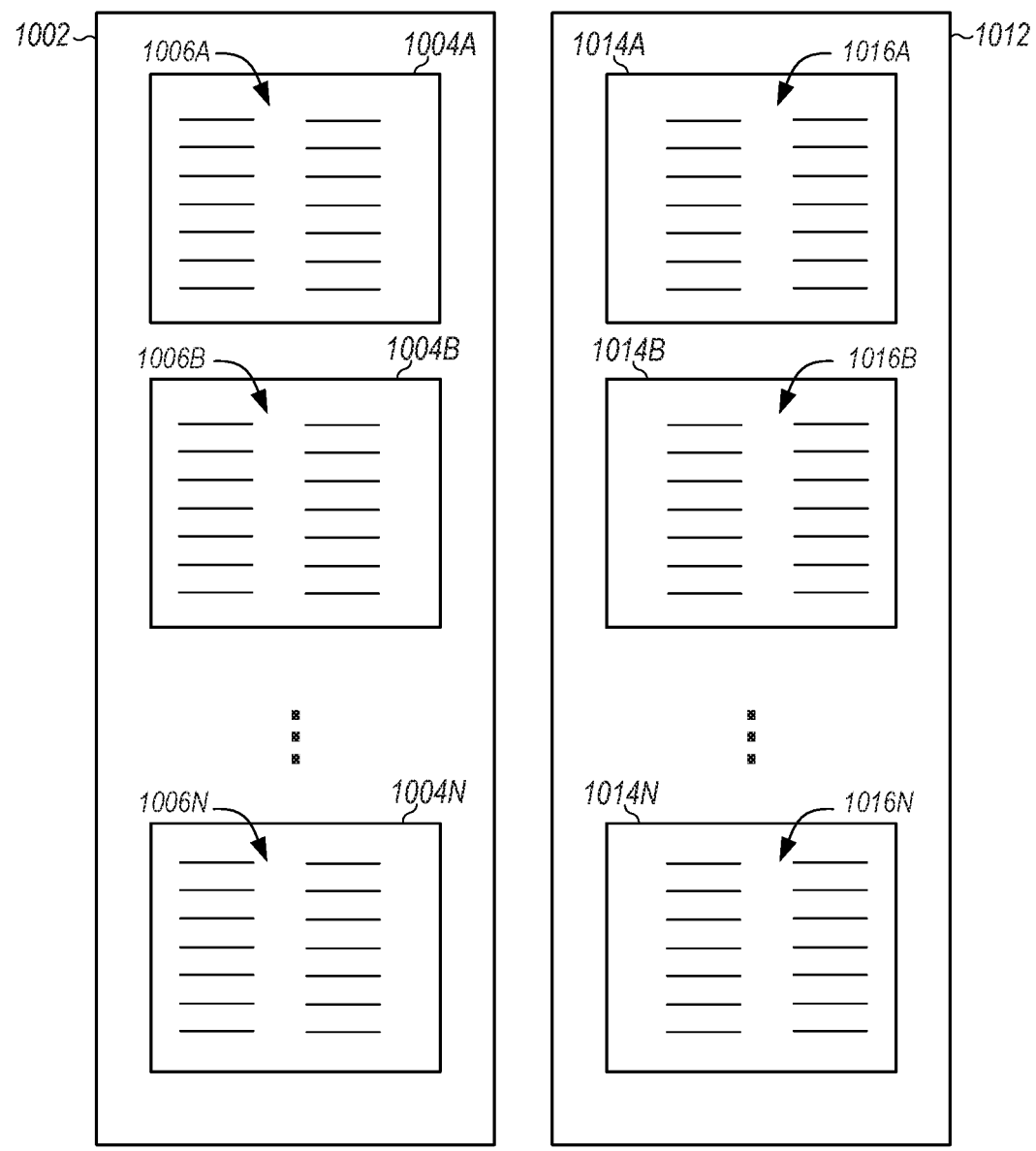
FIG. 10 is a diagram illustrating an example of the content of preprocessed MBSE works according to an illustrative embodiment.

FIG. 10 is a diagram illustrating an example of the preprocessed MBSE works according to an illustrative embodiment. A first preprocessed MBSE work 1002, and a second preprocessed MBSE work 1012 are depicted, each being stored in a physical medium as a data structure containing a plurality of segments corresponding to statements. First preprocessed MBSE work 1002 includes segments 1004A, 1004B, . . . , 1004N. Second preprocessed MBSE work 1012 includes segments 1014A, 1014B, . . . , 1014N. Each segment 1004, 1014 contains a corresponding expanded set of terms 1006A, 1006B, . . . , 1006N (for segments 1004); and expanded sets 1016A, 1016B, . . . , 1016N (for segments 1014).

Figure 11:
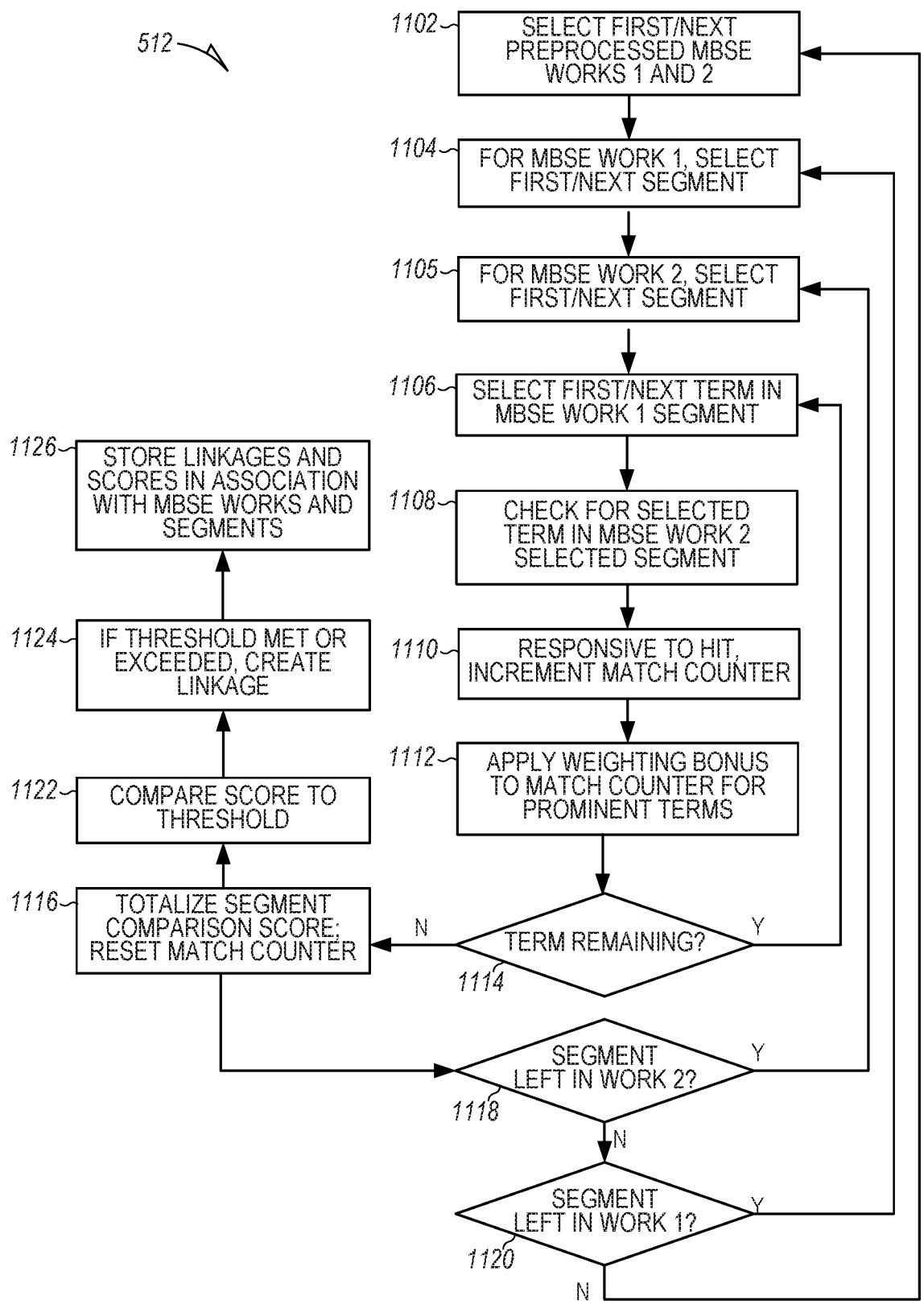
FIG. 11 is a flow diagram illustrating an example set of operations for performing comparison operations according to various embodiments.

As depicted in the processes of FIG. 5, at 512, statement comparator engine 166 compares MBSE work statements against one another as an inter-work statement comparison operations to produce linkage determinations as between the MBSE works. FIG. 11 is a flow diagram illustrating an example set of operations for performing the comparison operations according to various embodiments. At 1102, MBSE works to be compared, such as MBSE works 1002 and 1012 (FIG. 10) are selected from among the MBSE works of a project. The selection of the MBSE works for the current comparison may be accomplished by selecting the next pairing of MBSE works from a list of MBSE works subject to comparison, for example. For purposes of this example, these works are referred to as MBSE works 1 and 2. At 1104, the first segment of MBSE work 1 (e.g., 1004A) is selected for linkage-determination processing. Likewise, at 1105, the first segment of MBSE work 2 (e.g., 1014A) is selected. At 1106, the first term of the expanded set of terms (e.g., 1006A) of the selected segment of MBSE work 1 is selected for comparison processing. At 1108, the selected segment (e.g., 1016A) of MBSE work 2 is scanned for the presence of the selected term from the currently-selected segment of MBSE work 1.

At 1110, in response to a hit, i.e., the presence of the searched-for term in the selected segment of MBSE work 2, a match counter, which may be stored in a physical medium, is incremented. In embodiments utilizing proportional weighting of terms (taking into account their frequent use within the particular segment), a weighting bonus may be applied at 1112 to augment the match counter according to a defined weighting factor.

At decision 1114, the process loops to 1106 to select the next term in the current segment of MBSE work 1 to be searched for in the current segment of MBSE work 2, provided that there are further unsearched terms remaining in the current segment of MBSE work 1. This loop continues until all of the terms of the current segment of MBSE work 1 are searched. Upon completion of the current segment of MBSE work 1, the segment comparison score corresponding to the two segments being compared from across MBSE works 1 and 2 is totalized at 1116 and stored in a table or other suitable data structure to be stored in a physical medium, that associates the segment comparison score with the MBSE works and segments that were the subject of the comparison, and the match counter is reset for further processing. Totalization may include a normalization computation such as, for instance:

Segment Comparison Score=(Hits Count)*2/(Total Term Count).

At 1118, the process determines if any segments remain in MBSE work 2 and, in the affirmative case, the process loops to 1105 to select the next segment of MBSE work 2 (e.g., 1014B), and compare each of the terms of the current segment of MBSE 1 with the next selected segment of MBSE work 2. The process proceeds to search for the presence of each term of the current segment of MBSE work 1 among the terms of each segment of MBSE work 2. For each new segment-segment comparison, a corresponding segment comparison score is totalized and stored at 1116. Once each segment of MBSE work 2 has been searched, decision 1120 loops the process to 1104, at which point the next segment (e.g., 1004B) of MBSE work 1 is selected. Ultimately, the presence of each term of every segment of MBSE work 1 is searched among the terms of each segment of MBSE work 2, and each segment-segment pairing is assigned a corresponding score based on the hits count for that pairing.

After all segments of the MBSE works have been compared and scores totaled, each segment comparison score is compared against a defined threshold at 1122. The threshold may be predefined according to a user-selected value, or it may have been determined using a machine learning algorithm, according to some examples. In a related example, a fuzzy threshold is applied. At 1124, in response to meeting or exceeding of the threshold, a linkage for the segment pair is created. The linkage may be further appraised based on the corresponding comparison scoring. For example, a linkage appraisal value equal to, or algorithmically derived from, the totalized comparison scoring, may be associated with the linkage. Thus, some linkages may be found to be more prominent than others. At 1126, the linkages and their individual scores, if applicable, are stored in association with the MBSE works and the segments that were compared.

Upon completion of assessing the linkages as between the segments of MBSE works 1 and 2, the positions of MBSE works 1 and 2 may be reversed, with the presence of the terms of the segments of MBSE 2 being searched in each of the segments MBSE work 1. This re-positioning of keyword and corpus provides opportunity to detect additional linkages that may not have been detected in the first positioning. Any additional permutations of MBSE work pairings may be subsequently processed in the same manner to detect linkages.

Returning again to FIG. 5, at 514, linkage generator 168 produces generates and stores linkages found between the segments of all of the MBSE works. In some embodiments, as described above, the linkages include strength indicia and, where applicable, directionality. The linkages may be stored in linkage data store 178, and a report may be created that identifies each linkage, together with its linkage strength and directionality, along with indicators of mappings between the segments and the statements of each corresponding MBSE work. The report may be presented in tabular form, or it may be prepared in machine-readable format (e.g., XML) to be further processed for visual presentation at the UI.

Advantageously, the reporting of detected linkages and their scores may be used as a decision support system to assist human users in finding and assessing linkages between MBSE work statements. Although the system may certainly operate entirely autonomously, there may still be an option to utilize a human reviewer or team of reviewers. Accordingly, the reporting can inform users to quickly and efficiently decide if they should accept or modify linkage determinations. The reporting may further display a list of matching terms to help a person or team quickly and efficient decide if they should accept the proposed linkages. The reporting can quickly and efficiently search for similar linkages, which may be useful for supporting decisions as to whether to accept or reject a proposed linkage.

Figure 12:
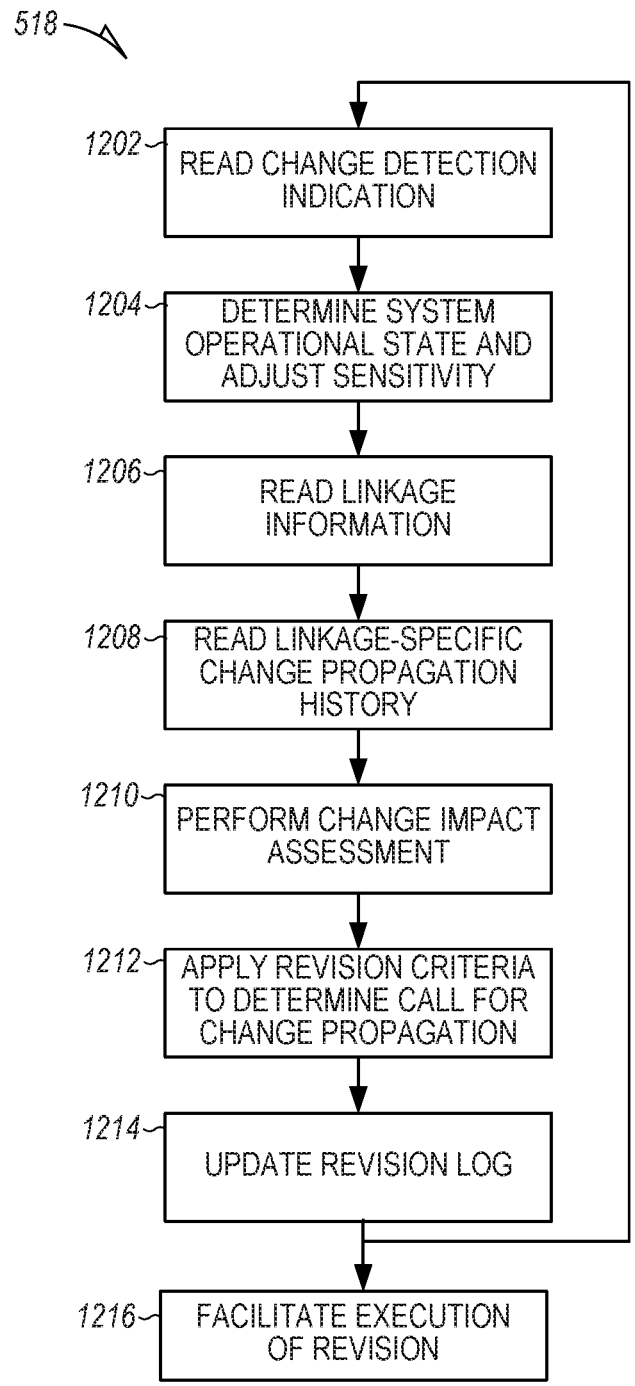
FIG. 12 is a flow diagram illustrating example operations for determining change propagation according to an example embodiment.

Returning to FIG. 5, at 516, change detector engine 182 of revision control engine 180 monitors and detects any changes to segments of the MBSE works. At 518, revision propagation decision engine 184 determines whether MBSE work statements should be updated in response to changes to linked MBSE work statements. FIG. 12 is a flow diagram illustrating example operations that make up operation 518 in greater detail according to an example.

At 1202, revision propagation decision engine 184 reads a current change detection indication pertaining to a MBSE work statement. This indication may be part of a database identifying changes throughout the MBSE project across numerous MBSE works. Changes may be logged by timestamp, for example.

At 1204, revision propagation decision engine 184 determines the system operational state based on information from system monitor engine 177, and adjusts decision sensitivity (e.g., threshold levels) in accordance with revision criteria 186. The thresholds that are adjustable according to various embodiments include the change-propagation threshold and change-extent threshold.

At 1206, revision propagation decision engine 184 reads relevant linkage information pertaining to the changed MBSE work statement from linkage store 178. The linkage information is informative as to which linked MBSE work statements are implicated for revision consideration in response to the detected change, and further indicates the previously-determined linkage strength for each linkage and linkage direction, where appropriate.

At 1208, revision propagation decision engine 184 reads the change propagation history pertaining to the linkages of the changed MBSE work statement.

At 1210, change impact assessor engine 188 performs change impact assessment to compute a change-impact score. The change impact assessment includes computationally comparing the differences in the pre- and post-change MBSE work statement against change impact criteria 190. Change impact criteria 190 may define certain types of changes that tend to produce a greater need to revise linked works. For instance, adding or removing a negation, (e.g., "no," "not," "never," etc.) changing a numerical value by at least 25%, or adding/removing a sentence, may be associated with a relatively higher change impact score than a change such as a spelling change or numerical-value change of less than 25%.

At 1212, revision propagation decision engine 184 applies revision criteria 186 to determine a call for change propagation to linked MBSE work statements. The decision may be individualized per linkage, or per linkage direction in embodiments where directionality is supported. The decision may be based on linkage strength, change impact assessment, or on a combination of these factors.

As discussed above, for each linkage (or linkage direction, the linkage strength may be compared against a change-propagation threshold before any linked MBSE-work statement is updated. For instance, linkages having a strength that meets or exceeds the change-propagation threshold are updated in the current revision cycle, whereas linkages having a strength score that does not meet the change-propagation threshold are not updated in the current revision cycle.

In embodiments utilizing change impact assessment, revision propagation decision engine 184 may compare the change impact score against the change-extent threshold as part of operation 1212. In related embodiments that also perform linkage-strength assessment, revision criteria may define both thresholds, the change-propagation threshold, and the change-extent threshold, to be met in order for the associated linked MBSE work statement may be updated.

At 1214, revision propagation decision engine 184 updates revision log 192 to indicate the revision decision for the current revision cycle. Updating of revision log 192 may include incrementing a counter or timestamp representing a time duration or revision cycle count corresponding to a particular linked MBSE work statement since a change to a counterpart MBSE work statement implicated the revision decision pertaining to the current MBSE work statement.

At 1216, revision engine 194 reads revision log 192, and facilitates execution of the revision. As discussed above, the facilitation of the execution of the decision may include rendering the update to the linked MBSE work statement, or generating a report or other indication to be read by a user or other entity tasked with carrying out the revision.

EXAMPLE CLAUSES

Below some aspects of the technology described herein are presented as example clauses. These example clauses do not limit the technology.

Example 1 is a computational accelerator system for facilitating change management of works in a model-based system engineering (MBSE) system, the computational accelerator system comprising: a MBSE work interface input to access content of MBSE works, wherein each of the MBSE works includes, a plurality of separately-identifiable statements; a linkage data store storing statement-wise, variable-strength linkages between certain statements of the MBSE works, wherein the linkages are indicative of associations between those certain statements; a revision control engine to detect changes made to statements of MBSE works, and to indicate calls for revision of other statements of the MBSE works in response to the detected changes, the revision control engine including a decision engine to determine the call for revision based on: a presence of linkages between the statements of the MBSE works and strengths of those linkages, wherein the linkage characteristics are stored in the linkage data store; and a current operational condition of the MBSE system; wherein in response to a detected change of a second statement under a first operational condition, the revision control engine is to: indicate a call for revision of a first statement having a relatively strong linkage to the second statement; and indicate no call for revision of a third statement having a relatively weak linkage to the second statement.

In Example 2, the subject matter of Example 1 includes, wherein the linkage data store stores the statement-wise, variable-strength linkages as a linkage set data structure.

In Example 3, the subject matter of Examples 1-2 includes, wherein the variable-strength of each linkage represents a measure of similarity between the statements associated with that linkage.

In Example 4, the subject matter of Examples 1-3 includes, wherein the variable-strength of each linkage is based on types of MBSE works from which statements associated with each linkage are present.

In Example 5, the subject matter of Examples 1-4 includes, wherein the variable-strength of each linkage is represented as a ratio.

In Example 6, the subject matter of Examples 1-5 includes, wherein the variable-strength of each linkage is represented as a strength categorization.

In Example 7, the subject matter of Examples 1-6 includes, wherein the variable-strength of each linkage is represented as a scalar value.

In Example 8, the subject matter of Examples 1-7 includes, wherein the variable-strength of each linkage is represented as a multi-dimensional value, wherein each dimension corresponds to a different attribute, and wherein each attribute has a corresponding strength score.

In Example 9, the subject matter of Examples 1-8 includes, wherein the statement-wise, variable-strength linkages between certain statements of the MBSE works include multiple directional linkages between individual pairs of MBSE work statements, wherein each pair of MBSE work statements includes: a first linkage having a first change-propagation direction and a corresponding first linkage strength; and a second linkage having a second change-propagation direction and a corresponding second linkage strength that is different from the first linkage strength.

In Example 10, the subject matter of Examples 1-9 includes, wherein in response to a detected change of the second statement under a second operational condition different from the first operational condition, the revision control engine is to: indicate a call for revision of the first statement having a relatively strong linkage to the second statement; and indicate a call for revision of the third statement having a relatively weak linkage to the second statement.

In Example 11, the subject matter of Examples 1-10 includes, wherein the current operational condition indicates a computational loading condition in the MBSE system.

In Example 12, the subject matter of Examples 1-11 includes, wherein the current operational condition indicates a networking congestion condition in the MBSE system.

In Example 13, the subject matter of Examples 1-12 includes, wherein the decision engine of the revision control engine is to compare strength indicia of each variable-strength link against a change-propagation threshold and, in response to a result of the comparison exceeding the change-propagation threshold, the decision engine generates the call for revision.

In Example 14, the subject matter of Examples 1-13 includes, wherein the change-propagation threshold is variable based on the current operational condition of the MBSE system.

In Example 15, the subject matter of Examples 1-14 includes, wherein the revision control engine is to store a result of the determination of the call for revision in a revision log, and wherein the strength of the variable-strength linkages is based on a values stored in the revision log.

In Example 16, the subject matter of Examples 1-15 includes, a linkage generator to autonomously determine the statement-wise, variable-strength linkages between the certain statements of the MBSE works.

In Example 17, the subject matter of Example 16 includes, wherein the linkage generator is to adjust a strength of a given variable-strength linkage between the first and the second statements based on a duration since the no-call for revision of the first statement was indicated in response to the detected change of the second statement.

In Example 18, the subject matter of Examples 1-17 includes, wherein the revision control engine is to compute a change-impact score that represents a measure of an extent of the change of the second statement, and wherein the call for revision of the first statement in response to the change in the second statement is based on the change-impact score.

In Example 19, the subject matter of Examples 1-18 includes, a MBSE work preprocessor configured to autonomously preprocess each MBSE work to produce a first preprocessed data structure representing the first MBSE work and a second preprocessed data structure representing the second MBSE work, and to delineate the respective content of each MBSE work into segments corresponding to separately identifiable statements of that MBSE work.

In Example 20, the subject matter of Example 19 includes, wherein the MBSE work preprocessor is further configured to autonomously perform a segment-wise comparison between segment pairings of the first preprocessed data structure and the second preprocessed data structure to produce a set of segment-wise comparison results based on content similarity among each segment pairing.

Example 21 is a method for facilitating change management of works in a model-based system engineering (MBSE) system, the method comprising: accessing, using a MBSE work interface input, content of MBSE works, wherein each of the MBSE works includes, a plurality of separately-identifiable statements; storing, in a linkage data store, statement-wise, variable-strength linkages between certain statements of the MBSE works, wherein the linkages are indicative of associations between those certain statements; detecting, using a revision control engine, changes made to statements of MBSE works, and to indicate calls for revision of other statements of the MBSE works in response to the detected changes, the revision control engine including a decision engine to determine the call for revision based on: a presence of linkages between the statements of the MBSE works and strengths of those linkages, wherein the linkage characteristics are stored in the linkage data store; and a current operational condition of the MBSE system; wherein in response to a detected change of a second statement under a first operational condition, the revision control engine is to: indicate a call for revision of a first statement having a relatively strong linkage to the second statement; and indicate no call for revision of a third statement having a relatively weak linkage to the second statement.

In Example 22, the subject matter of Example 21 includes, wherein the linkage data store stores the statement-wise, variable-strength linkages as a linkage set data structure.

Example 23 is a machine-readable medium for facilitating change management of works in a model-based system engineering (MBSE) system, the machine-readable medium storing instructions for performing operations comprising: accessing, using a MBSE work interface input, content of MBSE works, wherein each of the MBSE works includes, a plurality of separately-identifiable statements; storing, in a linkage data store, statement-wise, variable-strength linkages between certain statements of the MBSE works, wherein the linkages are indicative of associations between those certain statements; detecting, using a revision control engine, changes made to statements of MBSE works, and to indicate calls for revision of other statements of the MBSE works in response to the detected changes, the revision control engine including a decision engine to determine the call for revision based on: a presence of linkages between the statements of the MBSE works and strengths of those linkages, wherein the linkage characteristics are stored in the linkage data store; and a current operational condition of the MBSE system; wherein in response to a detected change of a second statement under a first operational condition, the revision control engine is to: indicate a call for revision of a first statement having a relatively strong linkage to the second statement; and indicate no call for revision of a third statement having a relatively weak linkage to the second statement.

In Example 24, the subject matter of Example 23 includes, wherein the variable-strength of each linkage represents a measure of similarity between the statements associated with that linkage.

In Example 25, the subject matter of Examples 23-24 includes, wherein the variable-strength of each linkage is based on types of MBSE works from which statements associated with each linkage are present.

Example 26 is at least one machine-readable medium including instructions that, when executed by processing circuitry, cause the processing circuitry to perform operations to implement of any of Examples 1-25.

Example 27 is an apparatus comprising means to implement of any of Examples 1-25.

Example 28 is a system to implement of any of Examples 1-25.

Example 29 is a method to implement of any of Examples 1-25.

Additional Notes & Examples

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A computational accelerator system for facilitating change management of works in a model-based system engineering (MBSE) system, the computational accelerator system comprising:
    a MBSE work interface input to access content of MBSE works, wherein each of the MBSE works includes a plurality of separately-identifiable statements;
    a linkage data store storing statement-wise, variable-strength linkages between certain statements of the MBSE works, wherein the linkages are indicative of associations between those certain statements;
    a revision control engine to detect changes made to statements of MBSE works, and to indicate calls for revision of other statements of the MBSE works in response to the detected changes, the revision control engine including a decision engine to determine the call for revision based on:
        a presence of linkages between the statements of the MBSE works and strengths of those linkages, wherein the linkage characteristics are stored in the linkage data store; and
        a current operational condition of the MBSE system;
    wherein in response to a detected change of a second statement under a first operational condition, the revision control engine is to:
        indicate a call for revision of a first statement having a relatively strong linkage to the second statement; and
        indicate no call for revision of a third statement having a relatively weak linkage to the second statement.

2. The computational accelerator system of claim 1, wherein the linkage data store stores the statement-wise, variable-strength linkages as a linkage set data structure.

3. The computational accelerator system of claim 1, wherein the variable-strength of each linkage represents a measure of similarity between the statements associated with that linkage.

4. The computational accelerator system of claim 1, wherein the variable-strength of each linkage is based on types of MBSE works from which statements associated with each linkage are present.

5. The computational accelerator system of claim 1, wherein the variable-strength of each linkage is represented as a ratio.

6. The computational accelerator system of claim 1, wherein the variable-strength of each linkage is represented as a strength categorization.

7. The computational accelerator system of claim 1, wherein the variable-strength of each linkage is represented as a scalar value.

8. The computational accelerator system of claim 1, wherein the variable-strength of each linkage is represented as a multi-dimensional value, wherein each dimension corresponds to a different attribute, and wherein each attribute has a corresponding strength score.

9. The computational accelerator system of claim 1, wherein the statement-wise, variable-strength linkages between certain statements of the MBSE works include multiple directional linkages between individual pairs of MBSE work statements, wherein each pair of MBSE work statements includes:
    a first linkage having a first change-propagation direction and a corresponding first linkage strength; and
    a second linkage having a second change-propagation direction and a corresponding second linkage strength that is different from the first linkage strength.

10. The computational accelerator system of claim 1, wherein in response to a detected change of the second statement under a second operational condition different from the first operational condition, the revision control engine is to:
    indicate a call for revision of the first statement having a relatively strong linkage to the second statement; and
    indicate a call for revision of the third statement having a relatively weak linkage to the second statement.

11. The computational accelerator system of claim 1, wherein the current operational condition indicates a computational loading condition in the MBSE system.

12. The computational accelerator system of claim 1, wherein the current operational condition indicates a networking congestion condition in the MBSE system.

13. The computational accelerator system of claim 1, wherein the decision engine of the revision control engine is to compare strength indicia of each variable-strength link against a change-propagation threshold and, in response to a result of the comparison exceeding the change-propagation threshold, the decision engine generates the call for revision.

14. The computational accelerator system of claim 1, wherein the change-propagation threshold is variable based on the current operational condition of the MBSE system.

15. The computational accelerator system of claim 1, wherein the revision control engine is to store a result of the determination of the call for revision in a revision log, and wherein the strength of the variable-strength linkages is based on a values stored in the revision log.

16. The computational accelerator system of claim 1, further comprising:
    a linkage generator to autonomously determine the statement-wise, variable-strength linkages between the certain statements of the MBSE works.

17. The computational accelerator system of claim 16, wherein the linkage generator is to adjust a strength of a given variable-strength linkage between the first and the second statements based on a duration since the no-call for revision of the first statement was indicated in response to the detected change of the second statement.

18. The computational accelerator system of claim 1, wherein the revision control engine is to compute a change-impact score that represents a measure of an extent of the change of the second statement, and wherein the call for revision of the first statement in response to the change in the second statement is based on the change-impact score.

19. The computational accelerator system of claim 1, further comprising:
    a MBSE work preprocessor configured to autonomously preprocess each MBSE work to produce a first preprocessed data structure representing the first MBSE work and a second preprocessed data structure representing the second MBSE work, and to delineate the respective content of each MBSE work into segments corresponding to separately identifiable statements of that MBSE work.

20. The computational accelerator system of claim 19, wherein the MBSE work preprocessor is further configured to autonomously perform a segment-wise comparison between segment pairings of the first preprocessed data structure and the second preprocessed data structure to produce a set of segment-wise comparison results based on content similarity among each segment pairing.

21. A method for facilitating change management of works in a model-based system engineering (MBSE) system, the method comprising:
    accessing, using a MBSE work interface input, content of MBSE works, wherein each of the MBSE works includes a plurality of separately-identifiable statements;
    storing, in a linkage data store, statement-wise, variable-strength linkages between certain statements of the MBSE works, wherein the linkages are indicative of associations between those certain statements;
    detecting, using a revision control engine, changes made to statements of MBSE works, and to indicate calls for revision of other statements of the MBSE works in response to the detected changes, the revision control engine including a decision engine to determine the call for revision based on:
        a presence of linkages between the statements of the MBSE works and strengths of those linkages, wherein the linkage characteristics are stored in the linkage data store; and
        a current operational condition of the MBSE system;
    wherein in response to a detected change of a second statement under a first operational condition, the revision control engine is to:
        indicate a call for revision of a first statement having a relatively strong linkage to the second statement; and
        indicate no call for revision of a third statement having a relatively weak linkage to the second statement.

22. The method of claim 21, wherein the linkage data store stores the statement-wise, variable-strength linkages as a linkage set data structure.

23. A non-transitory machine-readable medium for facilitating change management of works in a model-based system engineering (MBSE) system, the machine-readable medium storing instructions which, when executed by one or more machines, cause the one or more machines to perform operations comprising:
    accessing, using a MBSE work interface input, content of MBSE works, wherein each of the MBSE works includes a plurality of separately-identifiable statements;
    storing, in a linkage data store, statement-wise, variable-strength linkages between certain statements of the MBSE works, wherein the linkages are indicative of associations between those certain statements;
    detecting, using a revision control engine, changes made to statements of MBSE works, and to indicate calls for revision of other statements of the MBSE works in response to the detected changes, the revision control engine including a decision engine to determine the call for revision based on:
        a presence of linkages between the statements of the MBSE works and strengths of those linkages, wherein the linkage characteristics are stored in the linkage data store; and
        a current operational condition of the MBSE system;
    wherein in response to a detected change of a second statement under a first operational condition, the revision control engine is to:
        indicate a call for revision of a first statement having a relatively strong linkage to the second statement; and indicate no call for revision of a third statement having a relatively weak linkage to the second statement.

24. The machine-readable medium of claim 23, wherein the variable-strength of each linkage represents a measure of similarity between the statements associated with that linkage.

25. The machine-readable medium of claim 23, wherein the variable-strength of each linkage is based on types of MBSE works from which statements associated with each linkage are present.

* * * * *

UNITED STATES PATENT AND TRADEMARK OFFICE
CERTIFICATE OF CORRECTION

| | | |
|---|---|---|
| PATENT NO. | : 11,023,625 B2 | Page 1 of 1 |
| APPLICATION NO. | : 16/244420 | |
| DATED | : June 1, 2021 | |
| INVENTOR(S) | : Eck et al. | |

It is certified that error appears in the above-identified patent and that said Letters Patent is hereby corrected as shown below:

On the Title Page

Column 2, item [30], Line 2, delete "I5903525" and insert --I590352-- therefor

Page 2, Column 2, item [56], Lines 21-22, delete "Jul. 7, 2020" and insert --Jul. 13, 2020-- therefor In the Specification Column 17, Line 23, delete "radio front end module" and insert --radio_front_end_module-- therefor Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*